United States Patent
Alissa et al.

(10) Patent No.: US 11,985,802 B2
(45) Date of Patent: May 14, 2024

(54) CONTROL SYSTEMS AND PREDICTION METHODS FOR IT COOLING PERFORMANCE IN CONTAINMENT

(71) Applicant: The Research Foundation for The State University of new York, Binghamton, NY (US)

(72) Inventors: Husam Alissa, Redmond, WA (US); Kourosh Nemati, Rockville, MD (US); Baghat Sammakia, Binghamton, NY (US); Kanad Ghose, Vestal, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 471 days.

(21) Appl. No.: 17/384,733

(22) Filed: Jul. 24, 2021

(65) Prior Publication Data
US 2021/0360833 A1    Nov. 18, 2021

Related U.S. Application Data

(63) Continuation of application No. 15/879,163, filed on Jan. 24, 2018, now Pat. No. 11,076,509.

(60) Provisional application No. 62/449,847, filed on Jan. 24, 2017.

(51) Int. Cl.
*H05K 7/20* (2006.01)
*G05B 13/04* (2006.01)

(52) U.S. Cl.
CPC ....... *H05K 7/20836* (2013.01); *G05B 13/041* (2013.01); *H05K 7/20745* (2013.01)

(58) Field of Classification Search
CPC .......... H05K 7/20836; H05K 7/20745; G05B 13/041
See application file for complete search history.

(56) References Cited

U.S. PATENT DOCUMENTS

| | | |
|---|---|---|
| 6,244,984 B1 | 6/2001 | Dieterich |
| 6,694,759 B1 | 2/2004 | Bash et al. |
| 6,718,277 B2 | 4/2004 | Sharma |
| 6,819,563 B1 | 11/2004 | Chu et al. |

(Continued)

FOREIGN PATENT DOCUMENTS

| | | |
|---|---|---|
| CN | 103673200 B | 3/2014 |
| CN | 104061664 B | 9/2014 |

(Continued)

OTHER PUBLICATIONS

US 9,901,012 B2, 02/2018, Slessman (withdrawn)
U.S. Appl. No. 10/076,509, filed Sep. 18, 2018, Blanco.

*Primary Examiner* — Shon G Foley
(74) *Attorney, Agent, or Firm* — Hoffberg & Associates; Steven M. Hoffberg

(57) ABSTRACT

A method of controlling a data center having a cold air cooling system, and at least one containment structure, comprising: determining a minimum performance constraint; determining optimum states of the cold air cooling system, a controlled leakage of air across the containment structure between a hot region and a cold air region, and information technology equipment for performing tasks to meet the minimum performance constraint, to minimize operating cost; and generating control signals to the cold air cooling system, a controlled leakage device, and the information technology equipment in accordance with the determined optimum states.

20 Claims, 3 Drawing Sheets

(56) References Cited

U.S. PATENT DOCUMENTS

| | | |
|---|---|---|
| 6,868,682 B2 | 3/2005 | Sharma et al. |
| 7,010,392 B2 | 3/2006 | Bash et al. |
| 7,031,870 B2 | 4/2006 | Sharma et al. |
| 7,051,946 B2 | 5/2006 | Bash et al. |
| 7,086,603 B2 | 8/2006 | Bash et al. |
| 7,165,412 B1 | 1/2007 | Bean, Jr. |
| 7,194,337 B2 | 3/2007 | Sharma et al. |
| 7,197,433 B2 | 3/2007 | Patel et al. |
| 7,214,131 B2 | 5/2007 | Malone |
| 7,248,942 B2 | 7/2007 | Bash et al. |
| 7,259,963 B2 | 8/2007 | Germagian et al. |
| 7,266,964 B2 | 9/2007 | Vogel et al. |
| 7,313,461 B2 | 12/2007 | Sharma et al. |
| 7,325,410 B1 | 2/2008 | Bean, Jr. |
| 7,365,973 B2 | 4/2008 | Rasmussen et al. |
| 7,366,632 B2 | 4/2008 | Hamann et al. |
| 7,382,613 B2 | 6/2008 | Vinson et al. |
| 7,385,810 B2 | 6/2008 | Chu et al. |
| 7,403,391 B2 | 7/2008 | Germagian et al. |
| 7,418,825 B1 | 9/2008 | Bean, Jr. |
| 7,426,453 B2 | 9/2008 | Patel et al. |
| 7,438,638 B2 | 10/2008 | Lewis, II et al. |
| 7,447,920 B2 | 11/2008 | Sharma et al. |
| 7,463,950 B1 | 12/2008 | Brey et al. |
| 7,477,514 B2 | 1/2009 | Campbell et al. |
| 7,486,511 B1 | 2/2009 | Griffel et al. |
| 7,493,193 B2 | 2/2009 | Hyland et al. |
| 7,534,167 B2 | 5/2009 | Day |
| 7,542,285 B2 | 6/2009 | Colucci et al. |
| 7,542,287 B2 | 6/2009 | Lewis, II et al. |
| 7,584,021 B2 | 9/2009 | Bash et al. |
| 7,596,431 B1 | 9/2009 | Forman et al. |
| 7,596,476 B2 | 9/2009 | Rasmussen et al. |
| 7,620,480 B2 | 11/2009 | Patel et al. |
| 7,630,795 B2 | 12/2009 | Campbell et al. |
| 7,639,486 B2 | 12/2009 | Champion et al. |
| 7,643,291 B2 | 1/2010 | Mallia et al. |
| 7,646,590 B1 | 1/2010 | Corhodzic et al. |
| 7,646,603 B2 | 1/2010 | Bard et al. |
| 7,653,499 B2 | 1/2010 | Corrado et al. |
| 7,660,109 B2 | 2/2010 | Iyengar et al. |
| 7,660,121 B2 | 2/2010 | Campbell et al. |
| 7,676,280 B1 | 3/2010 | Bash et al. |
| 7,676,301 B2 | 3/2010 | Brey et al. |
| 7,707,880 B2 | 5/2010 | Campbell et al. |
| 7,739,073 B2 | 6/2010 | Hamann et al. |
| 7,756,667 B2 | 7/2010 | Hamann et al. |
| 7,757,506 B2 | 7/2010 | Ellsworth, Jr. et al. |
| 7,768,222 B2 | 8/2010 | Ahladas et al. |
| 7,768,780 B2 | 8/2010 | Coglitore et al. |
| 7,783,903 B2 | 8/2010 | Piazza |
| 7,791,882 B2 | 9/2010 | Chu et al. |
| 7,804,685 B2 | 9/2010 | Krietzman |
| 7,830,657 B2 | 11/2010 | Chu et al. |
| 7,841,199 B2 | 11/2010 | VanGilder et al. |
| 7,861,596 B2 | 1/2011 | Bean, Jr. |
| 7,867,070 B2 | 1/2011 | Day |
| 7,878,007 B2 | 2/2011 | Campbell et al. |
| 7,878,889 B2 | 2/2011 | Day |
| 7,881,910 B2 | 2/2011 | Rasmussen et al. |
| 7,883,266 B2 | 2/2011 | Campbell et al. |
| 7,885,795 B2 | 2/2011 | Rasmussen et al. |
| RE42,195 E | 3/2011 | Bash et al. |
| 7,905,096 B1 | 3/2011 | Campbell et al. |
| 7,907,402 B2 | 3/2011 | Caveney |
| 7,907,406 B1 | 3/2011 | Campbell et al. |
| 7,916,470 B2 | 3/2011 | Mills et al. |
| 7,933,739 B2 | 4/2011 | Brey et al. |
| 7,944,692 B2 | 5/2011 | Grantham et al. |
| 7,950,244 B2 | 5/2011 | Iyengar et al. |
| 7,952,869 B2 | 5/2011 | Lewis, II et al. |
| 7,957,132 B2 | 6/2011 | Fried |
| 7,958,219 B2 | 6/2011 | Collins et al. |
| 7,961,463 B2 | 6/2011 | Belady et al. |
| 7,963,118 B2 | 6/2011 | Porter et al. |
| 7,963,119 B2 | 6/2011 | Campbell et al. |
| 7,978,472 B2 | 7/2011 | Campbell et al. |
| 7,979,250 B2 | 7/2011 | Archibald et al. |
| 7,983,039 B1 | 7/2011 | Nguyen et al. |
| 7,990,709 B2 | 8/2011 | Campbell et al. |
| 7,991,592 B2 | 8/2011 | VanGilder et al. |
| 7,992,402 B2 | 8/2011 | VanGilder et al. |
| 8,001,403 B2 | 8/2011 | Hamilton et al. |
| 8,014,150 B2 | 9/2011 | Campbell et al. |
| 8,018,720 B2 | 9/2011 | Campbell et al. |
| 8,019,477 B2 | 9/2011 | Bash et al. |
| 8,027,162 B2 | 9/2011 | Campbell et al. |
| 8,031,468 B2 | 10/2011 | Bean, Jr. et al. |
| 8,032,767 B2 | 10/2011 | Belady et al. |
| 8,033,122 B2 | 10/2011 | Bean, Jr. |
| 8,035,972 B2 | 10/2011 | Ostwald et al. |
| 8,040,673 B2 | 10/2011 | Krietzman |
| 8,051,671 B2 | 11/2011 | Vinson et al. |
| 8,053,748 B2 | 11/2011 | Shah et al. |
| 8,053,926 B2 | 11/2011 | Lehmann et al. |
| 8,059,405 B2 | 11/2011 | Campbell et al. |
| 8,068,340 B1 | 11/2011 | Nguyen et al. |
| 8,072,780 B1 | 12/2011 | Roy |
| 8,077,462 B2 | 12/2011 | Barringer et al. |
| 8,107,238 B2 | 1/2012 | Krietzman et al. |
| 8,113,010 B2 | 2/2012 | Carlson |
| 8,120,916 B2 | 2/2012 | Schmidt et al. |
| 8,131,515 B2 | 3/2012 | Sharma et al. |
| 8,140,195 B2 | 3/2012 | Matteson et al. |
| 8,144,464 B2 | 3/2012 | VanDerVeen et al. |
| 8,144,467 B2 | 3/2012 | Campbell et al. |
| 8,145,363 B2 | 3/2012 | Bean, Jr. et al. |
| 8,154,870 B1 | 4/2012 | Czamara et al. |
| 8,156,753 B2 | 4/2012 | VanGilder et al. |
| 8,157,626 B2 | 4/2012 | Day |
| 8,160,838 B2 | 4/2012 | Ramin et al. |
| 8,164,897 B2 | 4/2012 | Graybill et al. |
| 8,174,829 B1 | 5/2012 | Rotheroe |
| 8,175,753 B2 | 5/2012 | Sawczak et al. |
| 8,179,677 B2 | 5/2012 | Campbell et al. |
| 8,180,494 B2 | 5/2012 | Dawson et al. |
| 8,180,495 B1 | 5/2012 | Roy |
| 8,184,435 B2 | 5/2012 | Bean, Jr. et al. |
| 8,184,436 B2 | 5/2012 | Campbell et al. |
| 8,189,334 B2 | 5/2012 | Campbell et al. |
| 8,194,406 B2 | 6/2012 | Campbell et al. |
| 8,201,028 B2 | 6/2012 | Sawczak et al. |
| 8,208,258 B2 | 6/2012 | Campbell et al. |
| 8,209,993 B2 | 7/2012 | Carlson et al. |
| 8,212,230 B2 | 7/2012 | Shah et al. |
| 8,219,362 B2 | 7/2012 | Shrivastava et al. |
| 8,223,495 B1 | 7/2012 | Carlson et al. |
| 8,224,488 B2 | 7/2012 | Collins et al. |
| 8,229,713 B2 | 7/2012 | Hamann et al. |
| 8,233,270 B2 | 7/2012 | Pierson et al. |
| 8,244,502 B2 | 8/2012 | Hamann et al. |
| 8,248,792 B2 | 8/2012 | Wei |
| 8,248,801 B2 | 8/2012 | Campbell et al. |
| 8,249,825 B2 | 8/2012 | VanGilder et al. |
| 8,250,382 B2 | 8/2012 | Maglione et al. |
| 8,250,877 B2 | 8/2012 | Correa et al. |
| 8,254,124 B2 | 8/2012 | Keisling et al. |
| 8,256,305 B2 | 9/2012 | Bean, Jr. et al. |
| 8,257,155 B2 | 9/2012 | Lewis, II |
| 8,259,449 B2 | 9/2012 | Novotny et al. |
| 8,270,161 B2 | 9/2012 | Archibald et al. |
| 8,270,171 B2 | 9/2012 | Narasimhan et al. |
| 8,274,790 B2 | 9/2012 | Campbell et al. |
| 8,286,442 B2 | 10/2012 | Carlson et al. |
| 8,297,067 B2 | 10/2012 | Keisling et al. |
| 8,297,069 B2 | 10/2012 | Novotny et al. |
| 8,305,757 B2 | 11/2012 | Keisling et al. |
| 8,306,794 B2 | 11/2012 | Hamann et al. |
| 8,310,832 B2 | 11/2012 | Vanderveen et al. |
| 8,315,841 B2 | 11/2012 | Rasmussen et al. |
| 8,321,182 B2 | 11/2012 | Lenchner et al. |
| 8,322,155 B2 | 12/2012 | Tutunoglu et al. |
| 8,327,656 B2 | 12/2012 | Tutunoglu et al. |
| 8,331,086 B1 | 12/2012 | Meissner |

(56) References Cited

U.S. PATENT DOCUMENTS

| | | |
|---|---|---|
| 8,345,423 B2 | 1/2013 | Campbell et al. |
| 8,346,398 B2 | 1/2013 | Ahmed et al. |
| 8,351,200 B2 | 1/2013 | Arimilli et al. |
| 8,351,206 B2 | 1/2013 | Campbell et al. |
| 8,352,085 B2 | 1/2013 | Marwah et al. |
| 8,355,890 B2 | 1/2013 | VanGilder et al. |
| 8,369,091 B2 | 2/2013 | Campbell et al. |
| 8,369,092 B2 | 2/2013 | Atkins et al. |
| 8,390,998 B2 | 3/2013 | Kliewer et al. |
| 8,400,765 B2 | 3/2013 | Ross |
| 8,405,977 B2 | 3/2013 | Lin |
| 8,405,982 B2 | 3/2013 | Grantham et al. |
| 8,407,004 B2 | 3/2013 | Ware |
| 8,416,565 B1 | 4/2013 | Ross |
| 8,422,218 B2 | 4/2013 | Fried et al. |
| 8,425,287 B2 | 4/2013 | Wexler |
| 8,427,830 B2 | 4/2013 | Absalom |
| 8,429,431 B2 | 4/2013 | Malik et al. |
| 8,433,547 B2 | 4/2013 | Dalgas et al. |
| 8,434,804 B2 | 5/2013 | Slessman |
| 8,437,881 B2 | 5/2013 | Sawczak et al. |
| 8,438,125 B2 | 5/2013 | Tung et al. |
| 8,467,906 B2 | 6/2013 | Michael et al. |
| 8,469,782 B1 | 6/2013 | Roy |
| 8,472,182 B2 | 6/2013 | Campbell et al. |
| 8,472,183 B1 | 6/2013 | Ross et al. |
| 8,473,108 B2 | 6/2013 | Mizuno et al. |
| 8,473,265 B2 | 6/2013 | Hlasny et al. |
| 8,477,491 B1 | 7/2013 | Ross et al. |
| 8,482,917 B2 | 7/2013 | Rose et al. |
| 8,490,679 B2 | 7/2013 | Campbell et al. |
| 8,490,709 B2 | 7/2013 | Prieur |
| 8,491,683 B1 | 7/2013 | Brown-Fitzpatrick et al. |
| 8,493,738 B2 | 7/2013 | Chainer et al. |
| 8,498,114 B2 | 7/2013 | Martini |
| 8,506,674 B1 | 8/2013 | Brown-Fitzpatrick et al. |
| 8,509,959 B2 | 8/2013 | Zhang et al. |
| 8,514,572 B2 | 8/2013 | Rogers |
| 8,514,575 B2 | 8/2013 | Goth et al. |
| 8,521,476 B2 | 8/2013 | Tung et al. |
| 8,523,643 B1 | 9/2013 | Roy |
| 8,532,826 B2 | 9/2013 | Moss et al. |
| 8,534,119 B2 | 9/2013 | Bean, Jr. et al. |
| 8,538,584 B2 | 9/2013 | Pandey et al. |
| 8,539,059 B2 | 9/2013 | Parolini et al. |
| 8,550,702 B2 | 10/2013 | Campbell et al. |
| 8,553,416 B1 | 10/2013 | Carlson et al. |
| 8,554,515 B2 | 10/2013 | VanGilder et al. |
| 8,560,677 B2 | 10/2013 | VanGilder et al. |
| 8,582,298 B2 | 11/2013 | Facusse et al. |
| 8,583,289 B2 | 11/2013 | Stack et al. |
| 8,583,290 B2 | 11/2013 | Campbell et al. |
| 8,590,333 B2 | 11/2013 | Carlson et al. |
| 8,591,300 B2 | 11/2013 | Slessman et al. |
| 8,594,985 B2 | 11/2013 | Hamann et al. |
| 8,600,560 B2 | 12/2013 | Smith et al. |
| 8,601,827 B2 | 12/2013 | Keisling et al. |
| 8,605,435 B1 | 12/2013 | Ashby |
| 8,613,229 B2 | 12/2013 | Bean, Jr. et al. |
| 8,619,425 B2 | 12/2013 | Campbell et al. |
| 8,626,918 B2 | 1/2014 | Moore et al. |
| 8,630,724 B2 | 1/2014 | Hamann et al. |
| 8,631,411 B1 | 1/2014 | Ghose |
| 8,634,962 B2 | 1/2014 | Federspiel et al. |
| 8,634,963 B2 | 1/2014 | Tozer et al. |
| 8,635,881 B2 | 1/2014 | Carlson et al. |
| 8,636,565 B2 | 1/2014 | Carlson et al. |
| 8,639,482 B2 | 1/2014 | Rasmussen et al. |
| 8,649,177 B2 | 2/2014 | Chainer et al. |
| 8,650,420 B2 | 2/2014 | Kato et al. |
| 8,671,294 B2 | 3/2014 | Malik et al. |
| 8,672,149 B2 | 3/2014 | Knight |
| 8,672,732 B2 | 3/2014 | Rasmussen et al. |
| 8,675,357 B2 | 3/2014 | Namek et al. |
| 8,684,802 B1 | 4/2014 | Gross et al. |
| 8,687,364 B2 | 4/2014 | Chainer et al. |
| 8,688,413 B2 | 4/2014 | Healey et al. |
| 8,689,861 B2 | 4/2014 | Campbell et al. |
| 8,690,651 B2 | 4/2014 | Honold et al. |
| 8,693,198 B2 | 4/2014 | Eckberg et al. |
| 8,693,199 B2 | 4/2014 | Eckberg et al. |
| 8,706,914 B2 | 4/2014 | Duchesneau |
| 8,706,915 B2 | 4/2014 | Duchesneau |
| 8,708,164 B2 | 4/2014 | Borowsky et al. |
| 8,711,563 B2 | 4/2014 | Campbell et al. |
| 8,712,735 B2 | 4/2014 | VanGilder et al. |
| 8,713,955 B2 | 5/2014 | Campbell et al. |
| 8,713,957 B2 | 5/2014 | Campbell et al. |
| 8,725,307 B2 | 5/2014 | Healey et al. |
| 8,727,227 B2 | 5/2014 | Bash et al. |
| 8,730,665 B2 | 5/2014 | Lewis, II et al. |
| 8,730,671 B2 | 5/2014 | VanDerVeen et al. |
| 8,731,883 B2 | 5/2014 | Hamann et al. |
| 8,733,812 B2 | 5/2014 | Slessman |
| 8,734,007 B2 | 5/2014 | Campbell et al. |
| 8,737,059 B2 | 5/2014 | Doerrich et al. |
| 8,737,068 B2 | 5/2014 | Krietzman et al. |
| 8,739,406 B2 | 6/2014 | Campbell et al. |
| 8,744,812 B2 | 6/2014 | Cruz |
| 8,756,040 B2 | 6/2014 | Cruz |
| 8,760,863 B2 | 6/2014 | Campbell et al. |
| 8,761,955 B2 | 6/2014 | Saigo et al. |
| 8,764,528 B2 | 7/2014 | Tresh et al. |
| 8,782,213 B2 | 7/2014 | Hsu et al. |
| 8,782,234 B2 | 7/2014 | Pienta et al. |
| 8,783,049 B2 | 7/2014 | Gloeckner et al. |
| 8,783,052 B2 | 7/2014 | Campbell et al. |
| 8,783,336 B2 | 7/2014 | Slessman |
| 8,789,384 B2 | 7/2014 | Eckberg et al. |
| 8,789,385 B2 | 7/2014 | Campbell et al. |
| 8,797,740 B2 | 8/2014 | Campbell et al. |
| 8,798,797 B2 | 8/2014 | Bauchot et al. |
| 8,804,333 B2 | 8/2014 | Ashby |
| 8,804,334 B2 | 8/2014 | Eckberg et al. |
| 8,806,749 B2 | 8/2014 | Campbell et al. |
| 8,813,515 B2 | 8/2014 | Campbell et al. |
| 8,817,465 B2 | 8/2014 | Campbell et al. |
| 8,817,474 B2 | 8/2014 | Campbell et al. |
| RE45,111 E | 9/2014 | Bean, Jr. |
| 8,820,113 B2 | 9/2014 | Heydari et al. |
| 8,824,143 B2 | 9/2014 | Campbell et al. |
| 8,825,451 B2 | 9/2014 | VanGilder et al. |
| 8,826,999 B2 | 9/2014 | Prieur |
| 8,833,001 B2 | 9/2014 | Gardner et al. |
| 8,833,096 B2 | 9/2014 | Campbell et al. |
| 8,842,432 B2 | 9/2014 | Ehlen |
| 8,842,433 B2 | 9/2014 | Koblenz et al. |
| 8,842,688 B2 | 9/2014 | Vahdat et al. |
| 8,845,403 B2 | 9/2014 | Archibald et al. |
| 8,849,630 B2 | 9/2014 | Amemiya et al. |
| 8,856,321 B2 | 10/2014 | Iyengar et al. |
| 8,857,202 B1 | 10/2014 | Meissner |
| 8,857,204 B2 | 10/2014 | Reytblat |
| 8,862,922 B2 | 10/2014 | Akers et al. |
| 8,867,209 B2 | 10/2014 | Campbell et al. |
| 8,878,852 B1 | 11/2014 | Klein et al. |
| 8,879,257 B2 | 11/2014 | Campbell et al. |
| 8,881,541 B2 | 11/2014 | Noll et al. |
| 8,885,335 B2 | 11/2014 | Magarelli |
| 8,888,158 B2 | 11/2014 | Slessman |
| 8,899,052 B2 | 12/2014 | Campbell et al. |
| 8,903,551 B2 | 12/2014 | El-Essawy et al. |
| 8,904,383 B2 | 12/2014 | Bash et al. |
| 8,908,368 B2 | 12/2014 | Campbell |
| 8,910,490 B2 | 12/2014 | Carr |
| 8,913,384 B2 | 12/2014 | David et al. |
| 8,914,155 B1 | 12/2014 | Shah et al. |
| 8,919,143 B2 | 12/2014 | Eckberg et al. |
| 8,922,998 B2 | 12/2014 | Campbell et al. |
| 8,924,026 B2 | 12/2014 | Federspiel et al. |
| 8,925,333 B2 | 1/2015 | Campbell et al. |
| 8,929,075 B2 | 1/2015 | Eckberg et al. |
| 8,929,080 B2 | 1/2015 | Campbell et al. |
| 8,934,242 B2 | 1/2015 | Bean, Jr. et al. |

(56) References Cited

U.S. PATENT DOCUMENTS

| | | | |
|---|---|---|---|
| 8,934,250 | B2 | 1/2015 | Campbell et al. |
| 8,936,497 | B2 | 1/2015 | Brodsky et al. |
| 8,937,405 | B2 | 1/2015 | Park |
| 8,937,810 | B2 | 1/2015 | Brunschwiler et al. |
| 8,941,256 | B1 | 1/2015 | Czamara et al. |
| 8,941,993 | B2 | 1/2015 | Eckberg et al. |
| 8,941,994 | B2 | 1/2015 | Campbell et al. |
| 8,943,757 | B2 | 2/2015 | Parizeau et al. |
| 8,947,873 | B2 | 2/2015 | Campbell et al. |
| 8,947,880 | B2 | 2/2015 | Archibald et al. |
| 8,949,081 | B2 | 2/2015 | Healey |
| 8,949,091 | B2 | 2/2015 | Bhagwat et al. |
| 8,950,239 | B2 | 2/2015 | Kuczynski et al. |
| 8,953,317 | B2 | 2/2015 | Campbell et al. |
| 8,953,320 | B2 | 2/2015 | Campbell et al. |
| 8,955,346 | B2 | 2/2015 | Campbell et al. |
| 8,955,347 | B2 | 2/2015 | Campbell et al. |
| 8,955,608 | B1 | 2/2015 | Christopulos |
| 8,959,941 | B2 | 2/2015 | Campbell et al. |
| 8,961,278 | B2 | 2/2015 | Coors |
| 8,964,384 | B2 | 2/2015 | Leigh et al. |
| 8,964,390 | B2 | 2/2015 | Campbell et al. |
| 8,964,391 | B2 | 2/2015 | Campbell et al. |
| 8,965,748 | B2 | 2/2015 | Iyengar et al. |
| 8,966,922 | B2 | 3/2015 | Campbell et al. |
| 8,972,217 | B2 | 3/2015 | VanGilder et al. |
| 8,973,380 | B2 | 3/2015 | Bean, Jr. et al. |
| 8,982,552 | B2 | 3/2015 | Roesner et al. |
| 8,983,674 | B2 | 3/2015 | Manzer |
| 8,984,906 | B2 | 3/2015 | Tozer |
| 8,985,847 | B2 | 3/2015 | Campbell et al. |
| 8,995,670 | B2 | 3/2015 | Lambert et al. |
| 8,996,180 | B2 | 3/2015 | VanGilder et al. |
| 8,996,193 | B2 | 3/2015 | Manzer |
| 9,007,221 | B2 | 4/2015 | Zeighami et al. |
| 9,009,968 | B2 | 4/2015 | Campbell et al. |
| 9,009,971 | B2 | 4/2015 | Campbell et al. |
| 9,010,449 | B2 | 4/2015 | Eckholm et al. |
| 9,013,872 | B2 | 4/2015 | Campbell et al. |
| 9,016,314 | B2 | 4/2015 | Eriksen et al. |
| 9,016,696 | B2 | 4/2015 | Borowsky et al. |
| 9,017,020 | B2 | 4/2015 | Charest |
| 9,017,154 | B2 | 4/2015 | Moss et al. |
| 9,017,155 | B2 | 4/2015 | Ohba et al. |
| 9,019,700 | B2 | 4/2015 | Ballantine et al. |
| 9,019,703 | B2 | 4/2015 | Petruzzo |
| 9,021,821 | B2 | 5/2015 | Dunnavant |
| 9,025,331 | B2 | 5/2015 | Campbell et al. |
| 9,025,332 | B2 | 5/2015 | Campbell et al. |
| 9,027,360 | B2 | 5/2015 | Chainer et al. |
| 9,032,742 | B2 | 5/2015 | Dunnavant |
| 9,038,404 | B2 | 5/2015 | Judge et al. |
| 9,038,406 | B2 | 5/2015 | Campbell et al. |
| 9,042,098 | B2 | 5/2015 | Campbell et al. |
| 9,042,099 | B2 | 5/2015 | Campbell et al. |
| 9,043,035 | B2 | 5/2015 | Chainer et al. |
| 9,043,173 | B2 | 5/2015 | Lehmann et al. |
| 9,045,995 | B2 | 6/2015 | Graybill et al. |
| 9,052,722 | B2 | 6/2015 | Chainer et al. |
| 9,055,696 | B2 | 6/2015 | Dunnavant |
| 9,059,372 | B2 | 6/2015 | Sicuranza |
| 9,060,449 | B2 | 6/2015 | Ehlen |
| 9,066,450 | B2 | 6/2015 | Bednarcik et al. |
| 9,066,460 | B2 | 6/2015 | Brunschwiler et al. |
| 9,069,534 | B2 | 6/2015 | Rogers |
| 9,072,196 | B2 | 6/2015 | Bauchot et al. |
| 9,072,200 | B2 | 6/2015 | Dersch et al. |
| 9,076,893 | B2 | 7/2015 | Irvin et al. |
| 9,084,369 | B2 | 7/2015 | Lewis, II et al. |
| 9,089,077 | B2 | 7/2015 | Ballantine et al. |
| 9,091,496 | B2 | 7/2015 | Imwalle et al. |
| 9,095,078 | B2 | 7/2015 | Chainer et al. |
| 9,095,889 | B2 | 8/2015 | Campbell et al. |
| 9,095,942 | B2 | 8/2015 | Campbell et al. |
| 9,101,078 | B2 | 8/2015 | Campbell et al. |
| 9,101,080 | B2 | 8/2015 | Czamara et al. |
| 9,104,387 | B1 | 8/2015 | Eichelberg |
| 9,110,476 | B2 | 8/2015 | David et al. |
| 9,115,916 | B2 | 8/2015 | Tutunoglu et al. |
| 9,116,897 | B2 | 8/2015 | Rowan et al. |
| 9,119,326 | B2 | 8/2015 | McDonnell et al. |
| 9,119,329 | B2 | 8/2015 | Krietzman et al. |
| 9,121,618 | B2 | 9/2015 | Fisher et al. |
| 9,122,462 | B2 | 9/2015 | Ross |
| 9,132,519 | B2 | 9/2015 | Chainer et al. |
| 9,137,930 | B2 | 9/2015 | Alshinnawi et al. |
| 9,140,475 | B2 | 9/2015 | Schrader et al. |
| 9,141,155 | B2 | 9/2015 | Wiley |
| 9,143,392 | B2 | 9/2015 | Duchesneau |
| 9,144,181 | B2 | 9/2015 | Wiley |
| 9,145,677 | B2 | 9/2015 | Wang et al. |
| 9,148,980 | B2 | 9/2015 | Moss et al. |
| 9,148,982 | B2 | 9/2015 | Campbell et al. |
| 9,148,983 | B2 | 9/2015 | Campbell et al. |
| 9,152,191 | B1 | 10/2015 | Gardner |
| 9,157,812 | B1 | 10/2015 | Gennello |
| 9,158,310 | B2 | 10/2015 | Geissler et al. |
| 9,158,311 | B2 | 10/2015 | Geissler et al. |
| 9,158,345 | B1 | 10/2015 | Rice et al. |
| 9,167,721 | B2 | 10/2015 | Campbell et al. |
| 9,173,324 | B2 | 10/2015 | Campbell et al. |
| 9,173,327 | B2 | 10/2015 | Wiley |
| 9,176,508 | B2 | 11/2015 | Geissler et al. |
| 9,182,480 | B2 | 11/2015 | Larson et al. |
| 9,183,104 | B2 | 11/2015 | Brodsky et al. |
| 9,185,830 | B2 | 11/2015 | Chainer et al. |
| 9,189,039 | B2 | 11/2015 | Okitsu et al. |
| 9,192,078 | B2 | 11/2015 | Pronozuk et al. |
| 9,195,243 | B2 | 11/2015 | Chang |
| 9,198,310 | B2 | 11/2015 | Eichelberg et al. |
| 9,198,321 | B1 | 11/2015 | Heydari |
| 9,198,331 | B2 | 11/2015 | Roy |
| 9,204,576 | B2 | 12/2015 | Goulden et al. |
| 9,204,578 | B2 | 12/2015 | Smith |
| 9,207,002 | B2 | 12/2015 | Campbell et al. |
| 9,210,830 | B2 | 12/2015 | Campbell et al. |
| 9,210,831 | B2 | 12/2015 | Arvelo et al. |
| 9,213,343 | B2 | 12/2015 | Campbell et al. |
| 9,218,008 | B2 | 12/2015 | Campbell et al. |
| 9,223,905 | B2 | 12/2015 | Dalgas et al. |
| 9,228,366 | B2 | 1/2016 | Parizeau et al. |
| 9,237,672 | B2 | 1/2016 | Slessman |
| 9,237,681 | B2 | 1/2016 | Slessman et al. |
| 9,241,427 | B1 | 1/2016 | Stevens et al. |
| 9,250,024 | B2 | 2/2016 | Campbell et al. |
| 9,258,930 | B2 | 2/2016 | Gardner et al. |
| 9,261,308 | B2 | 2/2016 | Campbell et al. |
| 9,261,310 | B2 | 2/2016 | Fried |
| 9,271,429 | B2 | 2/2016 | Mashiko et al. |
| 9,273,906 | B2 | 3/2016 | Goth et al. |
| 9,274,019 | B2 | 3/2016 | Bean, Jr. et al. |
| 9,274,824 | B2 | 3/2016 | Blake et al. |
| 9,278,303 | B1 | 3/2016 | Somani et al. |
| 9,282,678 | B2 | 3/2016 | Campbell et al. |
| 9,282,684 | B2 | 3/2016 | Keisling et al. |
| 9,285,050 | B2 | 3/2016 | Campbell et al. |
| 9,288,932 | B2 | 3/2016 | Campbell et al. |
| 9,291,281 | B2 | 3/2016 | Campbell et al. |
| 9,291,358 | B2 | 3/2016 | Federspiel et al. |
| 9,295,183 | B2 | 3/2016 | Bhagwat et al. |
| 9,301,432 | B2 | 3/2016 | Nelson et al. |
| 9,301,433 | B2 | 3/2016 | Campbell et al. |
| 9,303,926 | B2 | 4/2016 | Campbell et al. |
| 9,307,674 | B2 | 4/2016 | Chainer et al. |
| 9,310,852 | B2 | 4/2016 | Alshinnawi et al. |
| 9,310,855 | B2 | 4/2016 | Godrich et al. |
| 9,313,920 | B2 | 4/2016 | Campbell et al. |
| 9,313,929 | B1 | 4/2016 | Malone et al. |
| 9,313,930 | B2 | 4/2016 | Goth et al. |
| 9,313,931 | B2 | 4/2016 | Goth et al. |
| 9,314,886 | B2 | 4/2016 | Eckberg et al. |
| 9,316,424 | B2 | 4/2016 | Lin et al. |
| 9,317,045 | B2 | 4/2016 | Federspiel et al. |
| 9,319,295 | B2 | 4/2016 | Sturgeon et al. |

(56) References Cited

U.S. PATENT DOCUMENTS

| | | |
|---|---|---|
| 9,320,177 B2 | 4/2016 | Levesque |
| 9,321,136 B2 | 4/2016 | Eckberg et al. |
| 9,323,631 B2 | 4/2016 | Brodsky et al. |
| 9,326,429 B2 | 4/2016 | Chainer et al. |
| 9,326,431 B2 | 4/2016 | Matsushita et al. |
| 9,332,674 B2 | 5/2016 | Campbell et al. |
| 9,338,924 B2 | 5/2016 | Campbell et al. |
| 9,342,079 B2 | 5/2016 | David et al. |
| 9,345,169 B1 | 5/2016 | Campbell et al. |
| 9,347,233 B2 | 5/2016 | Rogers |
| 9,347,834 B2 | 5/2016 | Adriaenssens et al. |
| 9,351,424 B2 | 5/2016 | Facusse et al. |
| 9,351,431 B2 | 5/2016 | Campbell et al. |
| 9,354,001 B2 | 5/2016 | Eckberg et al. |
| 9,357,671 B2 | 5/2016 | Long et al. |
| 9,357,674 B2 | 5/2016 | Campbell et al. |
| 9,357,675 B2 | 5/2016 | Campbell et al. |
| 9,357,681 B2 | 5/2016 | Ross et al. |
| 9,357,682 B2 | 5/2016 | Campbell et al. |
| 9,363,924 B2 | 6/2016 | Campbell et al. |
| 9,363,925 B2 | 6/2016 | Czamara et al. |
| 9,363,928 B2 | 6/2016 | Kondo et al. |
| 9,374,929 B1 | 6/2016 | Meissner |
| 9,377,832 B1 | 6/2016 | Heydari Monfared |
| 9,379,039 B2 | 6/2016 | Lam et al. |
| 9,380,727 B2 | 6/2016 | Bailey et al. |
| 9,382,817 B2 | 7/2016 | Somani et al. |
| 9,386,727 B2 | 7/2016 | Barringer et al. |
| 9,392,723 B2 | 7/2016 | Bailey |
| 9,392,733 B2 | 7/2016 | Day |
| 9,394,700 B1 | 7/2016 | Rodriguez |
| 9,395,974 B1 | 7/2016 | Eichelberg et al. |
| 9,408,329 B2 | 8/2016 | Iyengar et al. |
| 9,410,339 B2 | 8/2016 | Gardner et al. |
| 9,410,751 B2 | 8/2016 | David et al. |
| 9,413,630 B2 | 8/2016 | Sturgeon et al. |
| 9,414,519 B2 | 8/2016 | Campbell et al. |
| 9,414,523 B2 | 8/2016 | Chainer et al. |
| 9,414,525 B2 | 8/2016 | Campbell et al. |
| 9,418,179 B2 | 8/2016 | Zhang et al. |
| 9,420,721 B2 | 8/2016 | Campbell et al. |
| 9,420,726 B2 | 8/2016 | Kodama |
| 9,420,728 B2 | 8/2016 | Desiano et al. |
| 9,423,058 B2 | 8/2016 | Ellsworth, Jr. et al. |
| 9,423,854 B2 | 8/2016 | Palmer et al. |
| 9,426,932 B2 | 8/2016 | Kinstle et al. |
| 9,429,335 B2 | 8/2016 | Cader et al. |
| 9,430,010 B2 | 8/2016 | Palmer et al. |
| 9,433,119 B2 | 8/2016 | Canfield et al. |
| 9,438,087 B2 | 9/2016 | Czamara et al. |
| 9,439,325 B2 | 9/2016 | Campbell et al. |
| 9,445,529 B2 | 9/2016 | Chainer et al. |
| 9,445,530 B2 | 9/2016 | Reytblat et al. |
| 9,448,544 B2 | 9/2016 | Slessman et al. |
| 9,448,902 B2 | 9/2016 | Brodsky et al. |
| 9,451,729 B2 | 9/2016 | Bailey |
| 9,451,731 B2 | 9/2016 | Rasmussen et al. |
| 9,456,527 B2 | 9/2016 | Arvelo et al. |
| 9,459,633 B2 | 10/2016 | Geissler et al. |
| 9,462,729 B1 | 10/2016 | Campbell et al. |
| 9,468,126 B2 | 10/2016 | Pronozuk et al. |
| 9,470,439 B2 | 10/2016 | Campbell et al. |
| 9,474,186 B2 | 10/2016 | Campbell et al. |
| 9,474,190 B1 | 10/2016 | Beall et al. |
| 9,476,649 B2 | 10/2016 | Reytblat et al. |
| 9,476,657 B1 | 10/2016 | Pettis et al. |
| 9,483,090 B1 | 11/2016 | Ramesh et al. |
| 9,485,887 B1 | 11/2016 | Eichelberg et al. |
| 9,489,542 B2 | 11/2016 | Miller et al. |
| 9,491,892 B1 | 11/2016 | Carlson et al. |
| 9,492,899 B2 | 11/2016 | Eckberg et al. |
| 9,494,371 B2 | 11/2016 | Werner et al. |
| 9,504,184 B2 | 11/2016 | Krug, Jr. et al. |
| 9,504,189 B1 | 11/2016 | Campbell et al. |
| 9,507,393 B2 | 11/2016 | Alshinnawi et al. |
| 9,510,484 B1 | 11/2016 | Rodriguez |
| 9,510,485 B2 | 11/2016 | Schmitt et al. |
| 9,510,486 B1 | 11/2016 | Gravina |
| 9,512,611 B2 | 12/2016 | Schmitt et al. |
| 9,514,252 B2 | 12/2016 | van den Berghe |
| 9,519,517 B2 | 12/2016 | Dalgas et al. |
| 9,529,641 B2 | 12/2016 | Civilini |
| 9,534,776 B2 | 1/2017 | Irvin et al. |
| 9,537,291 B1 | 1/2017 | Wilding et al. |
| 9,537,522 B2 | 1/2017 | Ewing et al. |
| 9,538,688 B2 | 1/2017 | Fricker |
| 9,545,035 B2 | 1/2017 | Kodama |
| 9,549,488 B2 | 1/2017 | Zeighami et al. |
| 9,554,490 B2 | 1/2017 | Slessman |
| 9,554,491 B1 | 1/2017 | Wong et al. |
| 9,563,216 B1 | 2/2017 | Barroso et al. |
| 9,568,206 B2 | 2/2017 | Tutunoglu |
| 9,568,974 B2 | 2/2017 | Khuti et al. |
| 9,572,276 B2 | 2/2017 | Haroun |
| 9,578,784 B2 | 2/2017 | Stellick et al. |
| 9,578,786 B1 | 2/2017 | Beall et al. |
| 9,582,057 B2 | 2/2017 | Hartman |
| 9,585,282 B1 | 2/2017 | Gandhi et al. |
| 9,585,284 B2 | 2/2017 | Canfield et al. |
| 9,587,874 B2 | 3/2017 | Kodama |
| 9,591,790 B2 | 3/2017 | Eichelberg |
| 9,596,790 B2 | 3/2017 | Ambriz |
| 9,600,604 B2 | 3/2017 | CaraDonna et al. |
| 9,605,459 B2 | 3/2017 | Veino et al. |
| 9,605,855 B2 | 3/2017 | Takahashi et al. |
| 9,606,316 B1 | 3/2017 | Gandhi |
| 9,606,588 B2 | 3/2017 | Dean et al. |
| 9,622,387 B1 | 4/2017 | Czamara |
| 9,622,389 B1 | 4/2017 | Roy |
| 9,629,285 B1 | 4/2017 | Lachapelle et al. |
| 9,629,286 B2 | 4/2017 | Campbell et al. |
| 9,631,880 B2 | 4/2017 | Eckberg et al. |
| 9,635,785 B1 | 4/2017 | Heydari et al. |
| 9,638,583 B2 | 5/2017 | Ross et al. |
| 9,642,286 B1 | 5/2017 | Gutierrez et al. |
| 9,645,622 B2 | 5/2017 | Ogawa et al. |
| 9,648,784 B2 | 5/2017 | Keisling et al. |
| 9,648,787 B2 | 5/2017 | Rogers |
| 9,651,275 B2 | 5/2017 | Cader et al. |
| 9,655,259 B2 | 5/2017 | North et al. |
| 9,655,282 B2 | 5/2017 | Barringer et al. |
| 9,655,284 B2 | 5/2017 | Milligan et al. |
| 9,655,286 B2 | 5/2017 | Krug, Jr. et al. |
| 9,661,788 B2 | 5/2017 | Slessman et al. |
| 9,668,368 B2 | 5/2017 | Cox et al. |
| 9,668,369 B2 | 5/2017 | Cox et al. |
| 9,670,689 B2 | 6/2017 | Dechene et al. |
| 9,671,837 B2 | 6/2017 | Ruiz et al. |
| 9,678,843 B2 | 6/2017 | Brodsky et al. |
| 9,679,087 B2 | 6/2017 | Hamann et al. |
| 9,681,586 B2 | 6/2017 | Bailey et al. |
| 9,684,806 B2 | 6/2017 | Bailey |
| 9,686,889 B2 | 6/2017 | Campbell et al. |
| 9,686,891 B2 | 6/2017 | Campbell et al. |
| 9,699,933 B2 | 7/2017 | Masuyama et al. |
| 9,702,580 B2 | 7/2017 | Minegishi et al. |
| 9,706,685 B2 | 7/2017 | Harvey et al. |
| 9,706,689 B2 | 7/2017 | Levesque |
| 9,709,965 B2 | 7/2017 | Slessman et al. |
| 9,715,222 B2 | 7/2017 | Zimmermann et al. |
| 9,717,165 B2 | 7/2017 | Rogers |
| 9,723,756 B1 | 8/2017 | Masters et al. |
| 9,723,759 B2 | 8/2017 | Heydari et al. |
| 9,723,761 B2 | 8/2017 | Rogers |
| 9,723,762 B1 | 8/2017 | Ross et al. |
| 9,727,064 B2 | 8/2017 | VanGilder et al. |
| 9,727,432 B2 | 8/2017 | Cutforth et al. |
| 9,732,972 B2 | 8/2017 | Kodama et al. |
| 9,734,093 B2 | 8/2017 | Khemani et al. |
| 9,737,740 B2 | 8/2017 | Beresford |
| 9,743,559 B2 | 8/2017 | Ryu et al. |
| 9,743,561 B2 | 8/2017 | Desiano et al. |
| 9,743,562 B2 | 8/2017 | Desiano et al. |
| 9,746,109 B2 | 8/2017 | Ellsworth, Jr. et al. |

(56) References Cited

U.S. PATENT DOCUMENTS

| | | |
|---|---|---|
| 9,750,159 B2 | 8/2017 | Campbell et al. |
| 9,750,164 B2 | 8/2017 | Roy |
| 9,752,329 B2 | 9/2017 | Rodriguez |
| 9,760,098 B1 | 9/2017 | Imwalle et al. |
| 9,761,290 B1 | 9/2017 | Kankani et al. |
| 9,761,508 B2 | 9/2017 | Campbell et al. |
| 9,762,435 B2 | 9/2017 | Shelton et al. |
| 9,763,357 B2 | 9/2017 | Campbell et al. |
| 9,763,365 B2 | 9/2017 | Stocker et al. |
| 9,763,366 B2 | 9/2017 | Keisling et al. |
| 9,769,952 B2 | 9/2017 | Wands et al. |
| 9,769,960 B2 | 9/2017 | LeFebvre et al. |
| 9,772,610 B2 | 9/2017 | Slessman |
| 9,778,717 B2 | 10/2017 | Kaplan |
| 9,778,718 B2 | 10/2017 | Zacho |
| 9,788,455 B1 | 10/2017 | Roy |
| 9,790,701 B2 | 10/2017 | Ziegler |
| 9,791,837 B2 | 10/2017 | Slessman et al. |
| 9,795,055 B1 | 10/2017 | Campbell et al. |
| 9,795,061 B2 | 10/2017 | Roy |
| 9,795,062 B1 | 10/2017 | Ross et al. |
| 9,801,308 B2 | 10/2017 | Teeter et al. |
| 9,801,309 B2 | 10/2017 | Krietzman et al. |
| 9,801,312 B2 | 10/2017 | Kondo |
| 9,804,657 B2 | 10/2017 | Moss et al. |
| 9,807,911 B1 | 10/2017 | Bryan et al. |
| 9,811,097 B2 | 11/2017 | Arimilli et al. |
| 9,811,129 B2 | 11/2017 | Kobayashi et al. |
| 9,814,160 B2 | 11/2017 | Slessman et al. |
| 9,814,161 B2 | 11/2017 | Kondo et al. |
| 9,820,408 B2 | 11/2017 | Ross |
| 9,820,411 B2 | 11/2017 | Alshinnawi et al. |
| 9,820,412 B2 | 11/2017 | Karasawa et al. |
| 9,823,715 B1 | 11/2017 | Roy |
| 9,830,410 B2 | 11/2017 | VanGilder |
| 9,832,905 B2 | 11/2017 | Rivnay et al. |
| 9,832,911 B2 | 11/2017 | Cotton et al. |
| 9,839,162 B2 | 12/2017 | Crawford |
| 9,839,163 B2 | 12/2017 | Keisling et al. |
| 9,845,981 B2 | 12/2017 | Lu et al. |
| 9,848,516 B2 | 12/2017 | Heydari et al. |
| 9,851,781 B2 | 12/2017 | Kodama |
| 9,853,827 B1 | 12/2017 | Goodnow et al. |
| 9,854,712 B1 | 12/2017 | Ramesh et al. |
| 9,854,713 B2 | 12/2017 | Krug, Jr. et al. |
| 9,857,089 B2 | 1/2018 | Slessman et al. |
| 9,857,235 B2 | 1/2018 | Hamann et al. |
| 9,857,779 B2 | 1/2018 | Varadi |
| 9,858,795 B1 | 1/2018 | Camilo Gomes et al. |
| 9,861,012 B2 | 1/2018 | Krug, Jr. et al. |
| 9,861,013 B2 | 1/2018 | Edwards et al. |
| 9,861,014 B2 | 1/2018 | Zhang et al. |
| 9,863,659 B2 | 1/2018 | Palmer et al. |
| 9,865,522 B2 | 1/2018 | Campbell et al. |
| 9,867,318 B2 | 1/2018 | Eichelberg et al. |
| 9,869,982 B1 | 1/2018 | Clidaras et al. |
| 9,870,773 B2 | 1/2018 | German et al. |
| 9,872,417 B2 | 1/2018 | Held |
| 9,877,414 B2 | 1/2018 | Vorreiter |
| 9,879,926 B2 | 1/2018 | David et al. |
| 9,883,009 B2 | 1/2018 | Hamann et al. |
| 9,886,042 B2 | 2/2018 | Meijer et al. |
| 9,888,606 B1 | 2/2018 | Wendorf et al. |
| 9,888,614 B1 | 2/2018 | Ross et al. |
| 9,890,878 B2 | 2/2018 | Ellsworth, Jr. et al. |
| 9,894,807 B2 | 2/2018 | Bard et al. |
| 9,894,809 B1 | 2/2018 | Springs et al. |
| 9,901,011 B2 | 2/2018 | Heim et al. |
| 9,904,331 B2 | 2/2018 | VanGilder et al. |
| 9,907,213 B1 | 2/2018 | Gravina |
| 9,912,192 B2 | 3/2018 | Miller |
| 9,913,403 B2 | 3/2018 | Krug, Jr. et al. |
| 9,913,407 B2 | 3/2018 | Parizeau et al. |
| 9,913,410 B2 | 3/2018 | Ambriz |
| 9,918,409 B2 | 3/2018 | Edwards et al. |
| 9,920,750 B1 | 3/2018 | Ross |
| 9,923,766 B2 | 3/2018 | Palmer et al. |
| 9,930,806 B2 | 3/2018 | Chainer et al. |
| 9,930,807 B2 | 3/2018 | Chainer et al. |
| 9,930,812 B2 | 3/2018 | Vaney et al. |
| 9,930,813 B2 | 3/2018 | Meyer |
| 9,930,814 B2 | 3/2018 | Endo et al. |
| 9,935,524 B2 | 4/2018 | Schmitt et al. |
| 9,936,607 B2 | 4/2018 | Chainer et al. |
| 9,936,612 B2 | 4/2018 | Goulden et al. |
| 9,943,004 B2 | 4/2018 | Canfield et al. |
| 9,943,011 B2 | 4/2018 | Shrivastava et al. |
| 9,943,012 B2 | 4/2018 | Bailey |
| 9,949,399 B2 | 4/2018 | Canfield et al. |
| 9,949,410 B1 | 4/2018 | Kowalski et al. |
| 9,949,412 B2 | 4/2018 | Campbell et al. |
| 9,952,103 B2 | 4/2018 | VanGilder et al. |
| 9,958,178 B2 | 5/2018 | Palmer et al. |
| 9,958,277 B1 | 5/2018 | Espy et al. |
| 9,958,916 B2 | 5/2018 | Ogawa et al. |
| 9,959,371 B2 | 5/2018 | Singh et al. |
| 2004/0240514 A1 | 12/2004 | Bash et al. |
| 2005/0023363 A1 | 2/2005 | Sharma et al. |
| 2005/0096789 A1 | 5/2005 | Sharma et al. |
| 2005/0113978 A1 | 5/2005 | Sharma et al. |
| 2005/0173549 A1 | 8/2005 | Bash et al. |
| 2005/0187664 A1 | 8/2005 | Bash et al. |
| 2005/0225936 A1 | 10/2005 | Day |
| 2005/0228618 A1 | 10/2005 | Patel et al. |
| 2005/0267639 A1 | 12/2005 | Sharma et al. |
| 2005/0278069 A1 | 12/2005 | Bash et al. |
| 2005/0278070 A1 | 12/2005 | Bash et al. |
| 2006/0047808 A1 | 3/2006 | Sharma et al. |
| 2006/0161307 A1 | 7/2006 | Patel et al. |
| 2006/0171538 A1 | 8/2006 | Larson et al. |
| 2006/0259622 A1 | 11/2006 | Moore et al. |
| 2007/0032908 A1 | 2/2007 | Hyland et al. |
| 2007/0038414 A1 | 2/2007 | Rasmussen et al. |
| 2007/0074525 A1 | 4/2007 | Vinson et al. |
| 2007/0078635 A1 | 4/2007 | Rasmussen et al. |
| 2007/0100494 A1 | 5/2007 | Patel et al. |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0174024 A1 | 7/2007 | Rasmussen et al. |
| 2007/0183129 A1 | 8/2007 | Lewis et al. |
| 2007/0213000 A1 | 9/2007 | Day |
| 2008/0029250 A1 | 2/2008 | Carlson et al. |
| 2008/0041076 A1 | 2/2008 | Tutunoglu et al. |
| 2008/0041077 A1 | 2/2008 | Tutunoglu |
| 2008/0055848 A1 | 3/2008 | Hamburgen et al. |
| 2008/0055850 A1 | 3/2008 | Carlson et al. |
| 2008/0140259 A1 | 6/2008 | Bash et al. |
| 2008/0174954 A1 | 7/2008 | VanGilder et al. |
| 2008/0185446 A1 | 8/2008 | Tozer |
| 2008/0198549 A1 | 8/2008 | Rasmussen et al. |
| 2008/0245083 A1 | 10/2008 | Tutunoglu et al. |
| 2008/0259566 A1 | 10/2008 | Fried |
| 2008/0300725 A1 | 12/2008 | Brey et al. |
| 2008/0300818 A1 | 12/2008 | Brey et al. |
| 2009/0009958 A1 | 1/2009 | Pflueger |
| 2009/0016019 A1 | 1/2009 | Bandholz et al. |
| 2009/0021270 A1 | 1/2009 | Bandholz et al. |
| 2009/0044027 A1 | 2/2009 | Piazza |
| 2009/0055665 A1 | 2/2009 | Maglione et al. |
| 2009/0059523 A1 | 3/2009 | Mallia et al. |
| 2009/0112522 A1 | 4/2009 | Rasmussen |
| 2009/0132699 A1 | 5/2009 | Sharma et al. |
| 2009/0138313 A1 | 5/2009 | Morgan et al. |
| 2009/0157333 A1 | 6/2009 | Corrado et al. |
| 2009/0159866 A1 | 6/2009 | Shah et al. |
| 2009/0164811 A1 | 6/2009 | Sharma et al. |
| 2009/0173473 A1 | 7/2009 | Day |
| 2009/0204382 A1 | 8/2009 | Tung et al. |
| 2009/0207567 A1 | 8/2009 | Campbell et al. |
| 2009/0216910 A1 | 8/2009 | Duchesneau |
| 2009/0223240 A1 | 9/2009 | Bean, Jr. |
| 2009/0228726 A1 | 9/2009 | Malik et al. |
| 2009/0231152 A1 | 9/2009 | Tung et al. |

(56) References Cited

U.S. PATENT DOCUMENTS

| | | |
|---|---|---|
| 2009/0234613 A1 | 9/2009 | Brey et al. |
| 2009/0235097 A1 | 9/2009 | Hamilton et al. |
| 2009/0259343 A1 | 10/2009 | Rasmussen et al. |
| 2009/0268404 A1 | 10/2009 | Chu et al. |
| 2009/0292811 A1 | 11/2009 | Pienta et al. |
| 2009/0296342 A1 | 12/2009 | Matteson et al. |
| 2009/0309570 A1 | 12/2009 | Lehmann et al. |
| 2009/0319650 A1 | 12/2009 | Collins et al. |
| 2009/0326879 A1 | 12/2009 | Hamann et al. |
| 2009/0326884 A1 | 12/2009 | Amemiya et al. |
| 2010/0010688 A1 | 1/2010 | Hunter |
| 2010/0057263 A1 | 3/2010 | Tutunoglu |
| 2010/0076607 A1 | 3/2010 | Ahmed et al. |
| 2010/0106464 A1 | 4/2010 | Hlasny et al. |
| 2010/0136895 A1 | 6/2010 | Sgro |
| 2010/0139887 A1 | 6/2010 | Slessman |
| 2010/0139908 A1 | 6/2010 | Slessman |
| 2010/0141105 A1 | 6/2010 | Slessman |
| 2010/0144265 A1 | 6/2010 | Bednarcik et al. |
| 2010/0151781 A1 | 6/2010 | Slessman et al. |
| 2010/0186517 A1 | 7/2010 | Bean, Jr. |
| 2010/0190430 A1 | 7/2010 | Rodriguez et al. |
| 2010/0211810 A1 | 8/2010 | Zacho |
| 2010/0216388 A1 | 8/2010 | Tresh et al. |
| 2010/0248609 A1 | 9/2010 | Tresh et al. |
| 2010/0256959 A1 | 10/2010 | VanGilder et al. |
| 2010/0286955 A1 | 11/2010 | VanGilder et al. |
| 2010/0286956 A1 | 11/2010 | VanGilder et al. |
| 2010/0287018 A1 | 11/2010 | Shrivastava et al. |
| 2010/0292976 A1 | 11/2010 | Newcombe et al. |
| 2010/0300129 A1 | 12/2010 | Bean, Jr. et al. |
| 2011/0016342 A1 | 1/2011 | Rowan et al. |
| 2011/0040392 A1 | 2/2011 | Hamann et al. |
| 2011/0040532 A1 | 2/2011 | Hamann et al. |
| 2011/0063792 A1 | 3/2011 | Schmidt et al. |
| 2011/0071867 A1 | 3/2011 | Chen et al. |
| 2011/0077795 A1 | 3/2011 | VanGilder et al. |
| 2011/0094714 A1 | 4/2011 | Day |
| 2011/0100045 A1 | 5/2011 | Carlson |
| 2011/0100618 A1 | 5/2011 | Carlson |
| 2011/0105010 A1 | 5/2011 | Day |
| 2011/0107332 A1 | 5/2011 | Bash |
| 2011/0174001 A1 | 7/2011 | Carlson et al. |
| 2011/0203785 A1 | 8/2011 | Federspiel et al. |
| 2011/0207391 A1 | 8/2011 | Hamburgen et al. |
| 2011/0224837 A1 | 9/2011 | Moss et al. |
| 2011/0225997 A1 | 9/2011 | Gast, Jr. et al. |
| 2011/0239679 A1 | 10/2011 | Dechene et al. |
| 2011/0239680 A1 | 10/2011 | Dechene et al. |
| 2011/0239681 A1 | 10/2011 | Ziegler |
| 2011/0240265 A1 | 10/2011 | Dechene et al. |
| 2011/0240497 A1 | 10/2011 | Dechene et al. |
| 2011/0246147 A1 | 10/2011 | Rasmussen et al. |
| 2011/0261526 A1 | 10/2011 | Atkins et al. |
| 2011/0265983 A1 | 11/2011 | Pedersen |
| 2011/0270464 A1 | 11/2011 | Marwah et al. |
| 2011/0270539 A1 | 11/2011 | Ware |
| 2011/0277967 A1 | 11/2011 | Fried et al. |
| 2011/0298301 A1 | 12/2011 | Wong et al. |
| 2011/0301911 A1 | 12/2011 | VanGilder et al. |
| 2011/0307820 A1 | 12/2011 | Rasmussen et al. |
| 2012/0003912 A1 | 1/2012 | Hoover et al. |
| 2012/0020150 A1 | 1/2012 | Shah et al. |
| 2012/0030347 A1 | 2/2012 | Hsu et al. |
| 2012/0041569 A1 | 2/2012 | Zhang et al. |
| 2012/0048514 A1 | 3/2012 | Osbaugh |
| 2012/0052785 A1 | 3/2012 | Nagamatsu et al. |
| 2012/0053925 A1 | 3/2012 | Geffin et al. |
| 2012/0059628 A1 | 3/2012 | VanGilder et al. |
| 2012/0067136 A1 | 3/2012 | Bean, Jr. et al. |
| 2012/0071992 A1 | 3/2012 | VanGilder et al. |
| 2012/0101648 A1 | 4/2012 | Federspiel et al. |
| 2012/0109404 A1 | 5/2012 | Pandey et al. |
| 2012/0109619 A1 | 5/2012 | Gmach et al. |
| 2012/0116595 A1 | 5/2012 | Mizuno et al. |
| 2012/0138259 A1 | 6/2012 | Carlson |
| 2012/0158375 A1 | 6/2012 | Healey |
| 2012/0158387 A1 | 6/2012 | VanGilder et al. |
| 2012/0167670 A1 | 7/2012 | Bean, Jr. et al. |
| 2012/0170205 A1 | 7/2012 | Healey et al. |
| 2012/0197445 A1 | 8/2012 | Yoshida et al. |
| 2012/0197828 A1 | 8/2012 | Yi |
| 2012/0198253 A1 | 8/2012 | Kato et al. |
| 2012/0203516 A1 | 8/2012 | Hamann et al. |
| 2012/0215373 A1 | 8/2012 | Koblenz et al. |
| 2012/0226922 A1 | 9/2012 | Wang et al. |
| 2012/0232877 A1 | 9/2012 | Bhagwat et al. |
| 2012/0232879 A1 | 9/2012 | Iyengar et al. |
| 2012/0245905 A1 | 9/2012 | Dalgas et al. |
| 2012/0253710 A1 | 10/2012 | Lehmann et al. |
| 2012/0254400 A1 | 10/2012 | Iyengar et al. |
| 2012/0275610 A1 | 11/2012 | Lambert et al. |
| 2012/0278045 A1 | 11/2012 | Saigo et al. |
| 2012/0284216 A1 | 11/2012 | Hamann et al. |
| 2012/0298219 A1 | 11/2012 | Bean, Jr. et al. |
| 2012/0303164 A1 | 11/2012 | Smith et al. |
| 2012/0303166 A1 | 11/2012 | Chang |
| 2012/0303339 A1 | 11/2012 | Cruz |
| 2012/0303344 A1 | 11/2012 | Cruz |
| 2013/0006426 A1 | 1/2013 | Healey et al. |
| 2013/0025842 A1 | 1/2013 | Carlson et al. |
| 2013/0037254 A1 | 2/2013 | Carlson et al. |
| 2013/0042639 A1 | 2/2013 | Kobayashi et al. |
| 2013/0046514 A1 | 2/2013 | Shrivastava et al. |
| 2013/0062047 A1 | 3/2013 | Vaney et al. |
| 2013/0073258 A1 | 3/2013 | VanGilder et al. |
| 2013/0096905 A1 | 4/2013 | Iyengar et al. |
| 2013/0098085 A1 | 4/2013 | Judge et al. |
| 2013/0098086 A1 | 4/2013 | Sillato et al. |
| 2013/0098087 A1 | 4/2013 | Noll et al. |
| 2013/0098088 A1 | 4/2013 | Lin et al. |
| 2013/0110306 A1 | 5/2013 | Wang et al. |
| 2013/0128455 A1 | 5/2013 | Koblenz et al. |
| 2013/0128918 A1 | 5/2013 | Campbell et al. |
| 2013/0133350 A1 | 5/2013 | Reytblat |
| 2013/0139530 A1 | 6/2013 | Tutunoglu et al. |
| 2013/0148291 A1 | 6/2013 | Slessman |
| 2013/0158713 A1 | 6/2013 | Geissler et al. |
| 2013/0166258 A1 | 6/2013 | Hamann et al. |
| 2013/0178999 A1 | 7/2013 | Geissler et al. |
| 2013/0190899 A1 | 7/2013 | Slessman et al. |
| 2013/0191676 A1 | 7/2013 | Mase et al. |
| 2013/0211556 A1 | 8/2013 | Slessman et al. |
| 2013/0219060 A1 | 8/2013 | Sturgeon et al. |
| 2013/0227136 A1 | 8/2013 | Sturgeon et al. |
| 2013/0228313 A1 | 9/2013 | Fried |
| 2013/0233532 A1 | 9/2013 | Imwalle et al. |
| 2013/0238795 A1 | 9/2013 | Geffin et al. |
| 2013/0262685 A1 | 10/2013 | Shelton et al. |
| 2013/0273825 A1 | 10/2013 | Uno et al. |
| 2013/0306276 A1 | 11/2013 | Duchesneau |
| 2013/0312854 A1 | 11/2013 | Eriksen et al. |
| 2013/0317785 A1 | 11/2013 | Chainer et al. |
| 2013/0332757 A1 | 12/2013 | Moss et al. |
| 2013/0333401 A1 | 12/2013 | Long et al. |
| 2013/0340996 A1 | 12/2013 | David et al. |
| 2013/0345893 A1 | 12/2013 | David et al. |
| 2014/0002987 A1 | 1/2014 | Okitsu et al. |
| 2014/0011437 A1 | 1/2014 | Gosselin et al. |
| 2014/0013827 A1 | 1/2014 | Bean, Jr. et al. |
| 2014/0025968 A1 | 1/2014 | Khuti et al. |
| 2014/0029196 A1 | 1/2014 | Smith |
| 2014/0031956 A1 | 1/2014 | Slessman et al. |
| 2014/0039683 A1 | 2/2014 | Zimmermann et al. |
| 2014/0039852 A1 | 2/2014 | Zhang et al. |
| 2014/0046489 A1 | 2/2014 | Geissler et al. |
| 2014/0049899 A1 | 2/2014 | Manzer |
| 2014/0049905 A1 | 2/2014 | Manzer |
| 2014/0052311 A1 | 2/2014 | Geissler et al. |
| 2014/0052429 A1 | 2/2014 | Kelkar et al. |
| 2014/0064916 A1 | 3/2014 | Huang et al. |
| 2014/0078668 A1 | 3/2014 | Goulden et al. |
| 2014/0103678 A1 | 4/2014 | Slessman |
| 2014/0121843 A1 | 5/2014 | Federspiel et al. |

(56) References Cited

U.S. PATENT DOCUMENTS

| | | |
|---|---|---|
| 2014/0122033 A1 | 5/2014 | VanGilder et al. |
| 2014/0126149 A1 | 5/2014 | Campbell et al. |
| 2014/0126151 A1 | 5/2014 | Campbell et al. |
| 2014/0133092 A1 | 5/2014 | Leckelt et al. |
| 2014/0141707 A1 | 5/2014 | Carlson et al. |
| 2014/0150480 A1 | 6/2014 | Kodama |
| 2014/0190191 A1 | 7/2014 | Slessman et al. |
| 2014/0190198 A1 | 7/2014 | Slessman et al. |
| 2014/0254085 A1 | 9/2014 | Slessman |
| 2014/0278333 A1 | 9/2014 | Gupta et al. |
| 2014/0287671 A1 | 9/2014 | Slessman |
| 2014/0297043 A1 | 10/2014 | Pienta et al. |
| 2014/0316583 A1 | 10/2014 | Ambriz et al. |
| 2014/0316586 A1 | 10/2014 | Boesveld et al. |
| 2014/0316605 A1 | 10/2014 | Conan et al. |
| 2014/0317281 A1 | 10/2014 | Hsu et al. |
| 2014/0317315 A1 | 10/2014 | Duchesneau |
| 2014/0330447 A1 | 11/2014 | VanGilder et al. |
| 2014/0337256 A1 | 11/2014 | Varadi et al. |
| 2014/0343745 A1 | 11/2014 | Slessman |
| 2014/0358471 A1 | 12/2014 | VanGilder et al. |
| 2014/0371920 A1 | 12/2014 | Varadi |
| 2015/0007171 A1 | 1/2015 | Blake et al. |
| 2015/0025833 A1 | 1/2015 | VanGilder |
| 2015/0028617 A1 | 1/2015 | Slessman |
| 2015/0032283 A1 | 1/2015 | Kelkar et al. |
| 2015/0032285 A1 | 1/2015 | Conan et al. |
| 2015/0056908 A1 | 2/2015 | Chapel et al. |
| 2015/0057828 A1 | 2/2015 | Civilini |
| 2015/0073606 A1 | 3/2015 | Ruiz et al. |
| 2015/0088319 A1 | 3/2015 | Dasari et al. |
| 2015/0096714 A1 | 4/2015 | Dagley et al. |
| 2015/0100165 A1 | 4/2015 | Federspiel et al. |
| 2015/0100297 A1 | 4/2015 | Singh et al. |
| 2015/0123562 A1 | 5/2015 | Adriaenssens et al. |
| 2015/0134123 A1 | 5/2015 | Obinelo |
| 2015/0138723 A1 | 5/2015 | Shedd et al. |
| 2015/0143834 A1 | 5/2015 | Reytblat et al. |
| 2015/0153109 A1 | 6/2015 | Reytblat et al. |
| 2015/0181752 A1 | 6/2015 | Bailey |
| 2015/0189796 A1 | 7/2015 | Shedd et al. |
| 2015/0192345 A1 | 7/2015 | McDonnell et al. |
| 2015/0192368 A1 | 7/2015 | Shedd et al. |
| 2015/0208549 A1 | 7/2015 | Shedd et al. |
| 2015/0221109 A1 | 8/2015 | Klein et al. |
| 2015/0230366 A1 | 8/2015 | Shedd et al. |
| 2015/0230367 A1 | 8/2015 | Judge et al. |
| 2015/0233619 A1 | 8/2015 | Shedd |
| 2015/0234397 A1 | 8/2015 | VanGilder et al. |
| 2015/0237767 A1 | 8/2015 | Shedd et al. |
| 2015/0241888 A1 | 8/2015 | Kodama |
| 2015/0257303 A1 | 9/2015 | Shedd |
| 2015/0261898 A1 | 9/2015 | Gupta et al. |
| 2015/0327407 A1 | 11/2015 | Bednarcik et al. |
| 2015/0331977 A1 | 11/2015 | Healey et al. |
| 2015/0334879 A1 | 11/2015 | Fricker |
| 2015/0337691 A1 | 11/2015 | Somani et al. |
| 2015/0351290 A1 | 12/2015 | Shedd |
| 2015/0363515 A1 | 12/2015 | Singh et al. |
| 2015/0378404 A1 | 12/2015 | Ogawa et al. |
| 2016/0021792 A1 | 1/2016 | Minegishi et al. |
| 2016/0040904 A1 | 2/2016 | Zhou et al. |
| 2016/0044629 A1 | 2/2016 | Larson et al. |
| 2016/0061495 A1 | 3/2016 | Sillato et al. |
| 2016/0061668 A1 | 3/2016 | Kasajima et al. |
| 2016/0062340 A1 | 3/2016 | Ogawa et al. |
| 2016/0076831 A1 | 3/2016 | Marchetti |
| 2016/0106009 A1 | 4/2016 | Slessman |
| 2016/0116224 A1 | 4/2016 | Shedd et al. |
| 2016/0118317 A1 | 4/2016 | Shedd et al. |
| 2016/0120019 A1 | 4/2016 | Shedd et al. |
| 2016/0120058 A1 | 4/2016 | Shedd et al. |
| 2016/0120059 A1 | 4/2016 | Shedd et al. |
| 2016/0120064 A1 | 4/2016 | Shedd et al. |
| 2016/0120065 A1 | 4/2016 | Shedd et al. |
| 2016/0120071 A1 | 4/2016 | Shedd et al. |
| 2016/0128238 A1 | 5/2016 | Shedd et al. |
| 2016/0135323 A1 | 5/2016 | Haroun |
| 2016/0146223 A1 | 5/2016 | Cao et al. |
| 2016/0157386 A1 | 6/2016 | Goulden et al. |
| 2016/0234972 A1 | 8/2016 | Billet et al. |
| 2016/0248631 A1 | 8/2016 | Duchesneau |
| 2016/0260018 A1 | 9/2016 | Ogawa et al. |
| 2016/0284962 A1 | 9/2016 | Harding |
| 2016/0290154 A1 | 10/2016 | Somani et al. |
| 2016/0295750 A1 | 10/2016 | Zhang et al. |
| 2016/0302323 A1 | 10/2016 | Gosselin |
| 2016/0324036 A1 | 11/2016 | Slessman et al. |
| 2016/0338230 A1 | 11/2016 | Kaplan et al. |
| 2016/0341813 A1 | 11/2016 | Ware |
| 2016/0349716 A1 | 12/2016 | Slessman et al. |
| 2016/0350456 A1 | 12/2016 | Cruz |
| 2016/0350457 A1 | 12/2016 | Cruz |
| 2016/0350459 A1 | 12/2016 | Cruz |
| 2016/0350460 A1 | 12/2016 | Cruz |
| 2017/0045548 A1 | 2/2017 | Booij et al. |
| 2017/0052978 A1 | 2/2017 | Gupta et al. |
| 2017/0083457 A1 | 3/2017 | Khemani et al. |
| 2017/0159951 A1 | 6/2017 | Slessman et al. |
| 2017/0176029 A1 | 6/2017 | Wilding et al. |
| 2017/0188486 A1 | 6/2017 | VanGilder et al. |
| 2017/0206026 A1 | 7/2017 | Narayanan et al. |
| 2017/0238444 A1 | 8/2017 | Slessman et al. |
| 2017/0295053 A1 | 10/2017 | Tung |
| 2017/0317828 A1 | 11/2017 | Reinhold |
| 2017/0322522 A1 | 11/2017 | Slessman et al. |
| 2017/0322572 A1 | 11/2017 | VanGilder et al. |
| 2017/0325362 A1 | 11/2017 | Slessman |
| 2017/0329649 A1 | 11/2017 | Cudak et al. |
| 2017/0336768 A1 | 11/2017 | Geffin |
| 2018/0014428 A1 | 1/2018 | Slessman et al. |
| 2018/0018003 A1 | 1/2018 | Leuthold |
| 2018/0058086 A1 | 3/2018 | Hubbard et al. |
| 2018/0095437 A1 | 4/2018 | Endo et al. |
| 2018/0107180 A1 | 4/2018 | Slessman |
| 2018/0119971 A1 | 5/2018 | Slessman et al. |

FOREIGN PATENT DOCUMENTS

| | | |
|---|---|---|
| CN | 104456843 A | 3/2015 |
| CN | 104964351 A | 10/2015 |
| CN | 105258260 A | 1/2016 |
| CN | 105444346 A | 3/2016 |
| CN | 105444373 A | 3/2016 |
| CN | 106052033 A | 10/2016 |
| EP | 2169328 A3 | 6/2014 |
| JP | 2012021711 A | 2/2012 |
| JP | 2012097914 A | 5/2012 |
| JP | 2014214944 A | 11/2014 |
| JP | 2015169367 A | 9/2015 |
| KR | 20120070123 A | 6/2012 |
| KR | 101545304 B1 | 8/2015 |
| NL | 1000658 C1 | 1/1996 |
| WO | WO2014022593 A1 | 2/2014 |

CONTROL SYSTEMS AND PREDICTION METHODS FOR IT COOLING PERFORMANCE IN CONTAINMENT

CROSS REFERENCE TO RELATED APPLICATIONS

The present application is a
Continuation of U.S. patent application Ser. No. 15/879,163, filed Jan. 24, 2018, now U.S. Pat. No. 10,076,509, issued Jul. 27, 2021, which is a
Non-provisional of, and claims benefit of priority from, U.S. Provisional Patent Application No. 62/449,847, filed Jan. 24, 2017, the entirety of which are expressly incorporated herein by reference.

GOVERNMENT SUPPORT CLAUSE

This invention was made with government support under contract 1134867 awarded by the National Science Foundation. The government has certain rights in the invention.

FIELD OF THE INVENTION

The present invention relates to the field of datacenter infrastructure control systems, and more particularly to systems and methods for using predictive control to enhance performance in containment.

BACKGROUND OF THE INVENTION

Containment solutions are becoming a standard practice in data centers today due to their inherent energy efficiency advantages. Cold aisle containment, hot aisle containment, chimney, enclosed racks and rear door heat exchangers are different forms of segregation between the cold and the hot air streams. The containment industry seeks to more perfectly seal the contained space, to mitigate intensified local hot spots. It also a common practice to tune the cooling units' blowers down to increase the Power usage effectiveness (PUE) of the facility. The challenge for such systems is that an airflow mismatch between cooling units and information technology (IT) equipment is possible. This can be exemplified in, during normal operation: at change in the application of the IT equipment, increasing set point of cooling units, virtualization scenarios, and during economizer hours; maintenance modes: filter replacement, power grid maintenance; and failures and outages.

During any case of airflow mismatch, the classical Data Center Infrastructure Management (DCIM) monitoring inlet sensors become discontinuous from Intelligent Platform Management Interface (IPMI) analytics, but also not representative of the IT equipment reliability. This happens because the external temperature sensors are agnostic to the heating rates of internal components that accelerate inside the server due to the airflow reduction.

See, U.S. Pat. Nos. 6,718,277; 7,010,392; 7,031,870; 7,086,603; 7,194,337; 7,197,433; 7,248,942; 7,313,461; 7,365,973; 7,426,453; 7,438,638; 7,447,920; 7,493,193; 7,534,167; 7,584,021; 7,596,431; 7,620,480; 7,630,795; 7,643,291; 7,653,499; 7,676,280; 7,783,903; 7,791,882; 7,867,070; 7,878,889; 7,933,739; 7,957,132; 7,958,219; 7,991,592; 8,001,403; 8,019,477; 8,033,122; 8,051,671; 8,053,748; 8,120,916; 8,131,515; 8,157,626; 8,180,494; 8,212,230; 8,244,502; 8,250,382; 8,250,877; 8,297,069; 8,306,794; 8,315,841; 8,322,155; 8,327,656; 8,346,398; 8,352,085; 8,369,092; 8,422,218; 8,429,431; 8,433,547; 8,473,108; 8,498,114; 8,514,572; 8,539,059; 8,554,515; 8,590,333; 8,626,918; 8,631,411; 8,671,294; 8,672,732; 8,688,413; 8,706,914; 8,706,915; 8,712,735; 8,725,307; 8,731,883; 8,764,528; 8,782,213; 8,782,234; 8,789,384; 8,820,113; 8,825,451; 8,842,433; 8,849,630; 8,856,321; 8,857,204; 8,862,922; 8,878,852; 8,904,383; 8,924,026; 8,949,081; 8,949,091; 8,965,748; 8,972,217; 8,983,674; 8,995,670; 8,996,180; 8,996,193; 9,016,314; 9,066,450; 9,069,534; 9,115,916; 9,116,897; 9,143,392; 9,148,982; 9,148,983; 9,158,310; 9,158,311; 9,176,508; 9,182,480; 9,195,243; 9,223,905; 9,261,310; 9,271,429; 9,291,358; 9,295,183; 9,392,733; 9,445,529; 9,445,530; 9,448,544; 9,451,731; 9,459,633; 9,476,649; RE42,195; 9,762,435; 9,734,093; 9,715,222; 9,568,974; 9,413,630; 9,319,295; 20050023363; 20050096789; 20050113978; 20050173549; 20050187664; 20050225936; 20050228618; 20050267639; 20050278069; 20050278070; 20060047808; 20060161307; 20060171538; 20060259622; 20070074525; 20070100494; 20070163748; 20070165377; 20070167125; 20070183129; 20070213000; 20080041076; 20080041077; 20080140259; 20080198549; 20080245083; 20080259566; 20090009958; 20090016019; 20090021270; 20090044027; 20090055665; 20090059523; 20090112522; 20090132699; 20090157333; 20090159866; 20090164811; 20090173473; 20090207567; 20090216910; 20090223240; 20090228726; 20090234613; 20090235097; 20090259343; 20090268404; 20090292811; 20090319650; 20090326884; 20100010688; 20100057263; 20100076607; 20100136895; 20100144265; 20100211810; 20100216388; 20100248609; 20100292976; 20110016342; 20110063792; 20110071867; 20110094714; 20110105010; 20110107332; 20110239679; 20110239680; 20110239681; 20110240265; 20110240497; 20110261526; 20110270464; 20110277967; 20110298301; 20110307820; 20120003912; 20120020150; 20120030347; 20120048514; 20120052785; 20120053925; 20120101648; 20120109619; 20120116595; 20120197445; 20120197828; 20120215373; 20120226922; 20120232877; 20120232879; 20120245905; 20120254400; 20120275610; 20120284216; 20120303166; 20130006426; 20130042639; 20130096905; 20130110306; 20130128455; 20130133350; 20130139530; 20130158713; 20130178999; 20130190899; 20130211556; 20130228313; 20130306276; 20130312854; 20130317785; 20140029196; 20140031956; 20140046489; 20140049899; 20140049905; 20140052311; 20140052429; 20140064916; 20140122033; 20140126149; 20140126151; 20140133092; 20140150480; 20140278333; 20140297043; 20140316583; 20140316586; 20140316605; 20140317281; 20140317315; 20140337256; 20140371920; 20150032283; 20150032285; 20150073606; 20150088319; 20150096714; 20150100165; 20150100297; 20150134123; 20150138723; 20150143834; 20150153109; 20150181752; 20150189796; 20150192345; 20150192368; 20150208549; 20150221109; 20150230366; 20150233619; 20150237767; 20150241888; 20150257303; 20150261898; 20150327407; 20150351290; 20150363515; 20160044629; 20160062340; 20160076831; 20160116224; 20160118317; 20160120019; 20160120058; 20160120059; 20160120064; 20160120065; 20160120071; 20160128238; 20160234972; 20160248631; 20160284962; 20160295750; 20160302323; 20160324036; 20160338230; 20160349716; 20160350456; 20160350457; 20160350459; 20160350460; 20170336768; 20170295053; 20170083457; 20170052978; 20160341813; 20140039683; 20140025968; 20130262685; 20130238795; 20130227136; 20130219060; CN103673200B; CN104061664B; CN104456843A; CN104964351A; CN105258260A; CN105444346A; CN105444373A; CN106052033A; EP2169328A3; JP2012021711A; JP2012097914A; JP2014214944A; JP2015169367A; KR101545304B1;

KR20120070123A; NL1000658C1; WO2014022593A1; each of which is expressly incorporated herein by reference in its entirety.

See also (each of which is expressly incorporated herein by reference in its entirety):

M. Herrlin, Thermal Guidelines for Data Processing Environments. Atlanta, GA, USA: ASHRAE Publications, 2012.

H. Geng, Data Center Handbook. Hoboken, NJ, USA: Wiley, 2012.

American Society of Heating Refrigerating and Air-Conditioning Engineers, Datacom Equipment Power Trends and Cooling Applications. Atlanta, GA, USA: ASHRAE Publications, 2005.

R. Schmidt, "Thermal profile of a high-density data center-methodology to thermally characterize a data center," in Proc. ASHRAE Symp., Nashville, TN, USA, June 2004, pp. 604-611.

R. Schmidt, M. Iyengar, and S. Mayhugh, "Thermal profile of world's 3rd fastest supercomputer—IBM's ASCI purple cluster," in Proc. Annu. ASHRAE Summer Conf., Montreal, QC, Canada, to be published.

Cost of Data Center Outages, Ponemon Inst., Traverse, MI, USA, 2013. [7] A. Radmehr, R. R. Schmidt, K. C. Karki, and S. V. Patankar, "Distributed leakage flow in raised-floor data centers," in Proc. ASME InterPACK, San Francisco, CA, USA, July 2005, pp. 401-408, paper IPACK2005-73273.

H. F. Hamann, M. Schappert, M. Iyengar, T. van Kessel, and A. Claassen, "Methods and techniques for measuring and improving data center best practices," in Proc. 11th ITherm, Orlando, FL, USA, May 2008, pp. 1146-1152.

E. Samadiani, J. Rambo, and Y. Joshi, "Numerical modeling of perforated tile flow distribution in a raised-floor data center," J. Electron. Packag., vol. 132, no. 2, pp. 021002-1-021002-8, May 2010.

M. Iyengar, R. R. Schmidt, H. Hamann, and J. VanGilder, "Comparison between numerical and experimental temperature distributions in a small data center test cell," in Proc. ASME InterPACK, Vancouver, BC, Canada, July 2007, pp. 819-826, paper IPACK2007-33508.

W. A. Abdelmaksoud, H. E. Khalifa, T. Q. Dang, B. Elhadidi, R. R. Schmidt, and M. Iyengar, "Experimental and computational study of perforated floor tile in data centers," in Proc. 12th IEEE Intersoc. Conf. Thermal Thermomech. Phenomena Electron. Syst. (ITherm), Las Vegas, NV, USA, June 2010, pp. 1-10.

S. A. Alkharabsheh, B. Muralidharan, M. Ibrahim, S. K. Shrivastava, and B. G. Sammakia, "Open and contained cold aisle experimentally validated CFD model implementing CRAC and server fan curves for a data center test laboratory," in Proc. InterPACK, Burlingame, CA, USA, 2013, pp. V002T09A018-1-V002T09A018-14.

S. Bhopte, B. Sammakia, M. K. Iyengar, and R. Schmidt, "Guidelines on managing under floor blockages for improved data center performance," in Proc. ASME Int. Mech. Eng. Congr. Expo. (IMECE), Chicago, IL, USA, November 2006, pp. 83-91, paper IMECE2006-13711.

H. Alissa, S. Alkharabsheh, S. Bhopte, and B. Sammakia, "Numerical investigation of underfloor obstructions in open-contained data center with fan curves," in Proc. IEEE ITherm, Orlando, FL, USA, May 2014, pp. 771-777.

D. King, M. Ross, M. Seymour, and T. Gregory, "Comparative analysis of data center design showing the benefits of server level simulation models," in Proc. IEEE SEMI-THERM Symp., San Jose, CA, USA, March 2014, pp. 193-196.

H. A. Alissa, K. Nemati, B. Sammakia, K. Ghose, M. Seymour, and R. Schmidt, "Innovative approaches of experimentally guided CFD modeling for data centers," in Proc. IEEE 31st SEMI-THERM Symp., San Jose, CA, USA, March 2015, pp. 176-184.

H. A. Alissa, K. Nemati, B. Sammakia, M. Seymour, K. Schneebeli, and R. Schmidt, "Experimental and numerical characterization of a raised floor data center using rapid operational flow curves model," in Proc. InterPACK, San Francisco, CA, USA, 2015, pp. V001T09A016-1-V001T09A016-12.

S. K. Shrivastava, A. R. Calder, and M. Ibrahim, "Quantitative comparison of air containment systems," in Proc. 13th IEEE ITherm, San Diego, CA, USA, May/June 2012, pp. 68-77.

Y. U. Makwana, A. R. Calder, and S. K. Shrivastava, "Benefits of properly sealing a cold aisle containment system," in Proc. IEEE ITherm, Orlando, FL, USA, May 2014, pp. 793-797.

V. Sundaralingam, V. K. Arghode, and Y. Joshi, "Experimental characterization of cold aisle containment for data centers," in Proc. 29th Annu. IEEE SEMI-THERM, San Jose, CA, USA, March 2013, pp. 223-230.

J. VanGilder and W. Torell, "Cooling entire data centers using only row cooling," APC, Andover, MA, USA, White Paper 139, 2011.

R. Y. Namek, "In row cooling options for high density IT applications," TSS, Columbia, MD, USA, Tech. Rep.

K. Nemati, H. Alissa, and B. Sammakia, "Performance of temperature controlled perimeter and row-based cooling systems in open and containment environment," in Proc. ASME Int. Mech. Eng. Congr. Expo. (IMECE), Houston, TX, USA, November 2015, pp. 1-9, paper IMECE2015-50782.

H. A. Alissa et al., "Steady state and transient comparison of perimeter and row-based cooling employing controlled cooling curves," in Proc. InterPACK, San Francisco, CA, USA, 2015, pp. V001T09A017-1-V001T09A017-14.

K. Nemati, H. A. Alissa, B. T. Murray, B. Sammakia, and M. Seymour, "Experimentally validated numerical model of a fully-enclosed hybrid cooled server cabinet," in Proc. InterPACK, San Francisco, CA, USA, 2015, pp. V001T09A041-1-V001T09A041-10.

S. K. Shrivastava and M. Ibrahim, "Benefit of cold aisle containment during cooling failure," in Proc. InterPACK, Burlingame, CA, USA, 2013, pp. V002T09A021-1-V002T09A021-7.

J. W. VanGilder and X. Zhang, "Cooling performance of ceiling-plenum-ducted containment systems in data centers," in Proc. Intersoc. Conf. Thermal Thermomech. Phenomena Electron. Syst. (ITherm), Orlando, FL, USA, May 2014, pp. 786-792.

D. Kennedy, "Ramifications of server airflow leakage with aisle containment," Tate, Jessup, MD, USA, White Paper, 2012.

ASHRAE Technical Committee 9.9, Data Center Networking Equipment—Issues and Best Practices. Atlanta, GA, USA: ASHRAE Publications, 2015.

J. W. VanGilder, Z. M. Pardey, C. M. Healey, and X. Zhang, "A compact server model for transient data center simulations," in Proc. Conf. ASHRAE, 2013, pp. 358-370.

6Sigma 9.3 User Manual, Future Facilities, San Jose, CA, USA, 2015. [32] I. E. Idelchik, Fluid Dynamics of Industrial Equipment: Flow Distribution Design Methods, N. A. Decker, Ed. Washington, DC, USA: Hemisphere Publishing Corporation, 1989.

Alissa, H., Nemati, K., Sammakia, B., Ghose, K., Seymour, M., King, D., Tipton, R., (2015, November). Ranking and Optimization Of CAC And HAC Leakage Using Pressure Controlled Models. In ASME 2015 International Mechanical Engineering Congress and Exposition. American Society of Mechanical Engineers, Houston, TX.

Shrivastava, S. K., & Ibrahim, M. (2013, July). Benefit of cold aisle containment during cooling failure. In ASME 2013 International Technical Conference and Exhibition on Packaging and Integration of Electronic and Photonic Microsystems (pp. V002T09A021-V002T09A021). American Society of Mechanical Engineers.

Alissa, H., A.; Nemati, K.; Sammakia, B. G.; Schneebeli, K.; Schmidt, R. R.; Seymour, M. J., "Chip to Facility Ramifications of Containment Solution on IT Airflow and Uptime," in Components, Packaging and Manufacturing Technology, IEEE Transactions on, vol. PP, no. 99, pp. 1-12, 2016.

Alissa, H., A., Nemati, K., Sammakia, B. G., Seymour, M. J., Tipton, R., Wu, T., Schneebeli, K., (2016, May). On Reliability and Uptime of IT in Contained Solution. In Thermal and Thermomechanical Phenomena in Electronic Systems (ITherm), 2016 IEEE Intersociety Conference IEEE.

Alissa, H., A., Nemati, K., Puvvadi, U., Sammakia, B. G., Mulay, V., Yan, M., R., Schneebeli, K., Seymour, M. J., Gregory, T., Effects of Airflow Imbalances on Open Compute High Density Storage Environment. Applied Thermal Engineering, 2016.

Alissa, H. A.; Nemati, K.; Sammakia, B. G.; Seymour, M. J.; Tipton, R.; Mendo, D.; Demetriou, D. W.; Schneebeli, K., "Chip to Chiller Experimental Cooling Failure Analysis of Data Centers Part I: Effect of Energy Efficiency Practices," in Components, Packaging and Manufacturing Technology, IEEE Transactions, 2016.

Wikipedia, (February 2016). Affinity laws. Available: en.wikipedia.org/wiki/Affinity_laws

SUMMARY OF THE INVENTION

The flow curves testing methods can describe the exact aerodynamic behavior of IT equipment.

The passive flow curve method (PFC) describes the passive airflow behavior of the chassis while it is not operational, as shown in FIG. 1. This gives information on the amount of airflow leakage in or out of the contained aisle through that specific IT equipment (inlet-outlet/outlet-inlet) based on the pressure differential input and static characteristics of the enclosure and its contents.

The active flow curve method (AFC) collapses the internal airflow resistance and the effect of its operational fans of the IT equipment into one analysis, as shown in FIG. 2. The free delivery (FD) and critical pressure ($P_c$) are used to rank IT equipment air systems. The resulting curve can be corrected to account for any new fan speed values. Thus, it is predictive of the airflow through the IT equipment (e.g., server) based on the input of pressure and IT equipment fan speed IT analytics. The analysis may be performed for each separate item of IT equipment, or on an aisle level, using average measurements. When conducted at an item level, the particular components may be considered with respect to pressure drop and heat load.

According to the present technology, the AFC can be integrated into a controller to identify the percentage of the current flow to the FD flow of each item of IT equipment. During the thermal compliance analysis procedure, the AFC curve can be related to the processor, RAM, HDD or SSD temperatures under different stress conditions, as shown in FIG. 3. The data are collected and correlations are built between the airflow, pressure and components temperature at specified external inlet temperature. Note that it is safe to apply superposition for higher inlet temperatures.

All this data feeds into a central controller that can specify the cooling region per IT equipment item, and give early indications of internal heating. This assists in avoiding CPU thermal throttling, which degrades application delivery and increases latency. That is, the central controller seeks to predict internal thermal (and secondary) feedback mechanisms within the IT equipment, and to maintain environmental conditions such that these internal feedback mechanisms do not unnecessarily degrade performance. In some cases, these mechanisms may be exploited, but since they are difficult to explicitly control, and reduce performance, generally they are relied upon as a backup safety measure and not a primary control mechanism, according to the present invention.

The controller modulates the cooling units and containment artificial (controllable) leakages. When any of the IT equipment indicates x % reduction (more than a predetermined or adaptively determined threshold) from the FD, the controller can: increase cooling airflow; introduce artificial leakage paths; and/or power cap the IT equipment with lower computational importance.

On the other hand the PFC can be used to predict the thermal impact of inactive servers (due load balancing scheme or otherwise) on the cooling efficiency of the contained space.

The present technology therefore provides a control system and method that predicts cooling performance of IT equipment based on, among other factors, pressure and fan speed data, and modulates the cooling system, containment structure and IT for reliable operation.

The airflow may be predicted for every single item of IT equipment using the AFC method, or only for significant elements. The significant elements are those that introduce significant variations in the heat load, and/or air flow or pressure.

Internal components temperatures (CPUs, RAMs, HDDs . . . ) may be reported directly, or using correlations from measured parameters.

The percentage of airflow surplus or reduction (airflow regions 1, 2 and 3) is reported to the controller, and the controller may then modulate the cooling airflow, the containment artificial leakage and utilization of the IT equipment. Each of these is an independent factor.

In case of airflow deficiency, the controller can operate to increase the cooling airflow, open leakage paths to maintain reliable operation, and avoid CPU throttling. In some cases, CPU throttling represents an optimal solution, and therefore the controller may act to trigger throttling, such as by restricting cold airflow to a server, raising its temperature, and causing a throttling response. For example, the heat load or power consumption in a portion of a facility may be deemed too high. While explicit control over processing load assignment is one option, this control may not be available for all elements within a rack, and leaving the system operational and cool may produce an undesired state or feedback to other control systems within the facility. Rather, by allowing the IT equipment to reach a stable elevated temperature, all thermal throttling will be appropriately engaged, and power consumption will thereby be reduced, and reporting to various operating systems and other control systems will be consistent with equipment in a low performance state. On the other hand, when high performance is desired, and an allocation of processing tasks to the IT hardware desired, the airflow increased and resulting temperatures to the IT equipment may be reduced.

In case of cooling airflow failure, maintenance or operational airflow mismatch, the system can give early alarms to predict or avoid overheating, and of loss in computational abilities when compared to external discrete sensors which respond only after the effect of the failure is evidenced.

In case of cooling airflow failure, the controller may balance the pressure by introducing smart leakage paths to the containment.

In case of disproportionate airflow reduction (when strong and weak IT air systems are mixed), the controller can power cap the IT equipment with stronger air systems to mitigate the airflow reduction in weaker IT air systems, since the IT equipment typically has thermally responsive fans, and a high load on a system with a strong air system will further imbalance the system, while reducing power consumption will tend to reduce fan speed and airflow.

In cases of inactive IT equipment (and in some cases, active IT equipment), the controller may determine the amount and direction of air leakage and indicate whether dampers are required to be operated.

The controller can modulate smart louvers that are mounted at the IT facility outlet vents.

It is therefore an object to provide a method of controlling a data center having a cold air cooling system, and at least one containment structure, comprising: determining a performance constraint, e.g., a minimum performance constraint for the information technology equipment; determining joint optimum states of the cold air cooling system, a controlled leakage of air across the containment structure between a hot region and a cold air region, and information technology equipment for performing tasks to meet the minimum performance constraint; and generating control signals to the cold air cooling system, a controlled leakage device, and the information technology equipment in accordance with the determined joint optimum states. The optimization may be an operating cost optimization.

It is also an object to provide a system for controlling a data center having a cold air cooling system, and at least one cold air containment structure, comprising: a sensor input, configured to receive sensor data representing thermal and pneumatic information from within the data center; at least one automated processor, configured to: determine a temperature-dependent performance constraint; determine, according to joint optimization criteria, joint optimum states of: the cold air cooling system, a controlled leakage device for controlling air flow across a boundary of the cold air containment structure, and information technology equipment for performing tasks to meet the performance constraint; and define control signals for the cold air cooling system, the controlled leakage device, and the information technology equipment, in accordance with the determined joint optimum states; and a control output, configured to provide control signals for the cold air cooling system, the controlled leakage device, and the information technology equipment.

It is a further object to provide a data center controller, comprising: a sensor input configured to receive at least thermal data from within a data center; at least one automated processor, configured to determine a set of jointly optimized states of a cold air cooling system for the data center, a controlled leakage device for controlling air flow across a boundary of a cold air containment structure within the data center, and information technology equipment within the data center for performing tasks; and define control signals for at least the controlled leakage device, in accordance with the determined joint optimum states; and a control output, configured to provide control signals for the controlled leakage device, dependent on the defined control signals. The method may further comprise receiving air pressure data from the at least one containment structure, thermal data, and fan speed data from the information technology equipment, and determining the optimum states selectively in dependence thereon.

The information technology equipment may have an intrinsic thermal excursion throttling response that reduces processing performance under predetermined thermal conditions, further comprising modelling the throttling response of the information technology equipment.

The determined optimum states may further provide a margin of statistical safety based on prior operating statistics of the data center. The determined optimum states may be dependent on a computational or numerical model of the data center. The determined optimum states may be dependent on a computational flow dynamics model of the cold air cooling system, information technology equipment, and the at least one containment structure. The determined optimum states may include, within a permissible range of operation, a predicted reverse flow of air through at least one element of information technology equipment from a hot aisle to a cold aisle. The determined optimum states may be dependent on an adaptively updated computational model of the data center. The determined optimum states may be dependent on an automatically defined computational model of the data center. The determined optimum states may be dependent on a hybrid of an automatically defined computational model of the data center and a physics model of the data center. The determined optimum states may be dependent on a predicted air flow through each piece of information technology equipment of the data center. The determining optimum states may be responsive to time lags within each of the cold air cooling system, a controlled leakage device, and the information technology equipment.

The information technology equipment may be distributed across a plurality of racks, further comprising optimizing a rack location within the data center of the information technology equipment where respective processing tasks are performed.

The method may further comprise predicting an air flow through each piece of information technology equipment of the data center.

The method may further comprise predicting a null air flow through each piece of information technology equipment of the data center due to back pressure against a fan.

The method may further comprise controlling the at least one containment structure to selectively vent in response to a control signal. The method may further comprise controlling a damper associated with the at least one containment structure to selectively restrict an air flow in response to a control signal.

The method may further comprise issuing a warning of a reduced computing performance or impending reduced computing performance of the information technology equipment due to a thermal event. The method may further comprise issuing a warning of a failure to meet the performance constraint. The method may further comprise issuing a warning of an overheating of a piece of information technology equipment.

The method may further comprise detecting an airflow reduction in the cold air cooling system, and imposing a power cap on certain information technology equipment with relatively higher capacity cooling fans to mitigate a reduction in available cold air to other information technology equipment with relatively lower capacity cooling fans.

DETAILED DESCRIPTION OF THE PREFERRED EMBODIMENT

Figure 1:
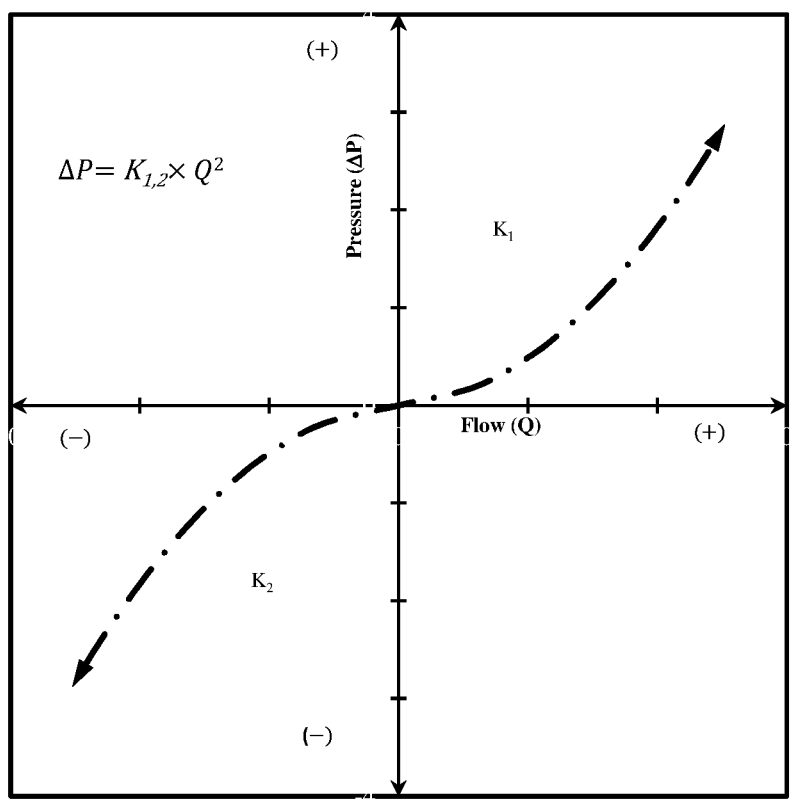
FIG. 1 shows an exemplary graph of flow vs. pressure for IT equipment.

Generally, a legacy data center consists of an array of hot and cold aisles where the air intake to the IT equipment resides in the cold aisle and the air exhaust of the equipment rejects hot air into the hot aisle. In a raised floor environment, chilled air is supplied through the plenum to the cold aisle. The heated air in the hot aisle flow backs to the cooling unit return.

However, the recirculation of air from hot to cold aisles or vice versa is a common occurrence. This air recirculation endangers the well-being of servers and reduces data center cooling efficiency, resulting in an increased total cost of operation. To resolve these issues cold or hot aisle containment (CAC or HAC) solutions were introduced to segregate the incoming cold air stream from the heated exhaust stream. CAC or HAC cooling solutions allow higher chilled set point temperature and can enhance the performance of an air side economizer, which admits outside air to the cool air stream (when outside temperatures are low enough).

This segregation of the hot and cold air streams is referred to as "containment". It is considered to be a key cooling solution in today's mission critical data centers. It promotes: (1) greater energy efficiency: by allowing cooling at higher set points, increasing the annual economizer hours and reducing chiller costs; (2) better use of the cold air and hence greater capacity: containment generates a higher temperature difference across the cooling unit making the most of the cooling coils capacity; and (3) lower likelihood of recirculation and therefore better resiliency (defined as the ability of a data center, to continue operating and recover quickly when experiencing a loss of cooling).

However, hot or cold aisle air containment (CAC or HAC) creates a new relationship between the air systems within respective IT equipment, and the airflow supply source at the facility level. In the legacy open air data center, each piece of IT equipment is able to get its necessary airflow (i.e., free delivery airflow), independent of airflow through the other neighboring IT equipment, and also independent of airflow through the perforated tiles through the full range of air system fan speeds (i.e., varying RPM).

To describe the potential issues with the containment, the design of a CAC system installed on a raised floor is explained. Other containment solutions will have analogous exposures. The CAC solution is constructed such that the cold aisle is boxed to segregate the cold aisle from the rest of the data center. Airflow leakage paths through the CAC are minimized by the design. The result is that airflow for the IT equipment is delivered through the raised floor perforated tiles within the CAC. This causes a new airflow relationship between all the IT equipment enclosed by the CAC. There is no longer an unlimited supply of low impedance airflow from the open air room for all the IT equipment within the CAC. Instead, there is effectively a single source of constrained airflow through the perforated tiles. All of the IT equipment air systems are operating in parallel with each other and are all in series with the perforated tiles. As a result, the air systems for all the IT equipment will compete with each other when the airflow in the CAC through the perforated tiles is less than the summation of the IT equipment free delivery (FD) airflows. It can now be understood that different IT equipment will receive differing percentages of their design FD airflow, depending on the differing performance of each IT equipment air system when they are competing in parallel for a constrained air supply.

Equipment airflow data is crucial to operate the data centers in which there is a perpetual deployment of containment solutions. IT equipment thermal compliance is based on an implicit assumption of a guaranteed free delivery airflow intake. However, the airflow mismatches and imbalances can occur due to one or more of the following reasons: inherent variable utilization of the IT equipment; the practice of increasing set points to save energy; load balancing and virtualization; IT equipment with differing air flow capacity stacked in the same containment; redundant or total cooling failure; air filter derating with time; environmental changes during free cooling; maintenance of redundant power lines; initial airflow assumptions at the design stage; presence of physical obstruction at airflow vents; or rack/IT specific reasons (e.g. side intake vents in a narrow rack). For these reasons, understanding the IT airflow demand based on load and utilization becomes vital.

Figure 2:
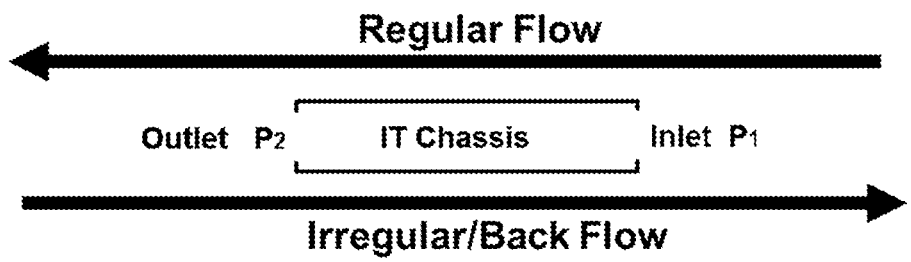
FIG. 2 shows a generic active flow curve (AFC) graph, indicating three regions in the airflow vs. pressure curve; Region 1 (over-provisioning); Region 2 (under-provisioning), and Region 3 (Reverse/Back Flow).
Figure 2:
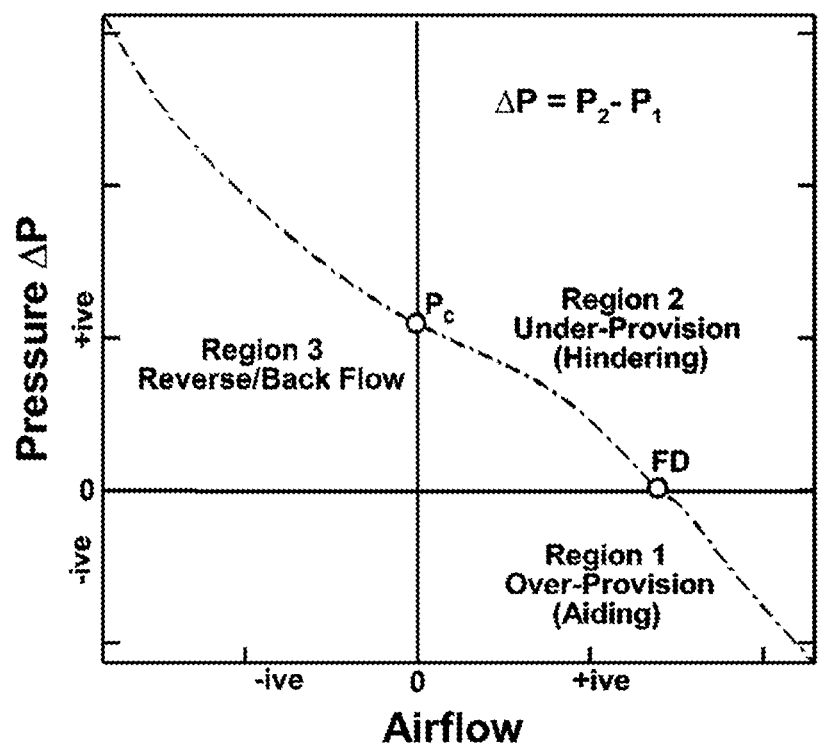

For physical illustration, a CAC scenario considered as an example. FIG. 2 shows the active flow curve (AFC) for a generic piece of IT equipment, where the pressure is measured at both the inlet and outlet [Alissa, H., A.; Nemati, K.; Sammakia, B. G.; Schneebeli, K.; Schmidt, R. R.; Seymour, M. J., "Chip to Facility Ramifications of Containment Solution on IT Airflow and Uptime," in Components, Packaging and Manufacturing Technology, IEEE Transactions on, vol. PP, no. 99, pp. 1-12, 2016.]. Again, referring to a CAC scenario, the inlet or P1 is in the contained cold aisle. The outlet P2 is measured at the open hot aisle side. Obviously, the chassis is designed to pull cold air from the cold to the hot aisles (i.e., Regular Flow). From an aerodynamic point of view, the flow curve includes three regions of airflow that an operating server can experience.

Region 1 represents aided airflow. An example can be an over-provisioned CAC where P2<P1. This will induce airflow rates that are higher than the free delivery or designed airflow through the IT equipment. Any operating point in this region has a negative backpressure differential based on the definition of $\Delta P$, and a flow rate that is always higher than point FD. The IT equipment is said to be at free delivery (FD) or design airflow when the backpressure differential is equal to zero, i.e., $P2-P1=0$. This is analogous to an open aisle configuration, where the cold and hot aisle pressures are equal, or even a CAC scenario with neutral provisioning and an ideally uniform pressure distribution. Note that the FD point is implicitly assumed by IT vendors when addressing thermal specifications. However, the designed airflow may not be the actual operating condition in a containment environment. Therefore, both the inlet temperature and flow rate should be specified for the IT equipment, especially when installed with a containment solution. This becomes of great importance when the supply temperature is increased for efficiency, inducing variations in the server's fan speeds, which are typically thermally responsive.

In region 2, the airflow of the IT equipment is lower than the free delivery. This can be explained by an under-provisioned CAC situation where P2>P1, hence, the positive backpressure differentials. As the differential increases, the airflow drops until reaching the critical pressure point at which P2−P1=PC, after which the IT equipment fans are incapable of pulling air through the system and into the hot aisle (airflow stagnation). Both points FD and PC are unique properties of any IT equipment and are important to be identified by IT vendor specifications.

If the backpressure differential exceeds the critical pressure, P2−P1>PC, then the system moves into region 3 in which the airflow is reversed which means that the backpressure is high enough to overcome the fans and induce back airflow from hot to cold aisles through the IT chassis. This irregular flow behavior occurs when placing IT equipment with different air flow capabilities in the same containment [Alissa, H., A.; Nemati, K.; Sammakia, B. G.; Schneebeli, K.; Schmidt, R. R.; Seymour, M. J., "Chip to Facility Ramifications of Containment Solution on IT Airflow and Uptime," in Components, Packaging and Manufacturing Technology, IEEE Transactions on, vol. PP, no. 99, pp. 1-12, 2016; Alissa, H., A., Nemati, K., Sammakia, B. G., Seymour, M. J., Tipton, R., Wu, T., Schneebeli, K., (2016, May). On Reliability and Uptime of IT in Contained Solution. In Thermal and Thermomechanical Phenomena in Electronic Systems (ITherm), 2016 IEEE Intersociety Conference IEEE]. Generally speaking, IT equipment reliability and availability are exposed to increased risk in both regions 2 and 3.

The AFC testing process [Alissa, H., A.; Nemati, K.; Sammakia, B. G.; Schneebeli, K.; Schmidt, R. R.; Seymour, M. J., "Chip to Facility Ramifications of Containment Solution on IT Airflow and Uptime," in Components, Packaging and Manufacturing Technology, IEEE Transactions on, vol. PP, no. 99, pp. 1-12, 2016.] is based on attaching operating servers at controlled fan speed to the flow bench and creating different imbalances that covers the three regions of airflow. The procedure was applied to five different IT chassis, that cover the airflow spectrum in the data center. Note that the fans are operated at maximum RPM, but curves at lower RPM can be derived from affinity laws.

Table 1 displays the main characteristic of each air system [Alissa, H., A.; Nemati, K.; Sammakia, B. G.; Schneebeli, K.; Schmidt, R. R.; Seymour, M. J., "Chip to Facility Ramifications of Containment Solution on IT Airflow and Uptime," in Components, Packaging and Manufacturing Technology, IEEE Transactions on, vol. PP, no. 99, pp. 1-12, 2016].

A 1U TOR (top of rack) switch represents the low end of the airflow spectrum (i.e., a weak air system). The critical pressure is at 25 Pa (0.10 in. H$_2$O) and the free delivery is 0.014 m$^3$/s (31.17 CFM).

A 9U BladeCenter has a free delivery airflow of 0.466 m$^3$/s (987.42 CFM) and the critical pressure is 1048 Pa (4.21 in. H$_2$O).

It is clear that the BladeCenter has the strongest air system when compared with all other IT equipment characterized. The importance of Table 1 is that it shows that during an airflow shortage event, the different pieces of IT equipment react differently, based on the relative strength of their air moving system. This indicates that some will fail or overheat before others do.

TABLE 1

IT AIR SYSTEMS CHARACTERISTICS

| IT | FD [m$^3$/s, CFM] | P$_c$ [Pa, in. H$_2$O] |
|---|---|---|
| 1U Switch | [0.014, 31.17] | [25, 0.10] |
| 1U Server | [0.034, 72.74] | [326, 1.31] |
| 2U Server | [0.046, 98.97] | [176, 0.71] |
| 2U Server NG | [0.066, 140.21] | [271, 1.09] |
| 9U Blade Server | [0.466, 987.42] | [1048, 4.21] |

Figure 3:
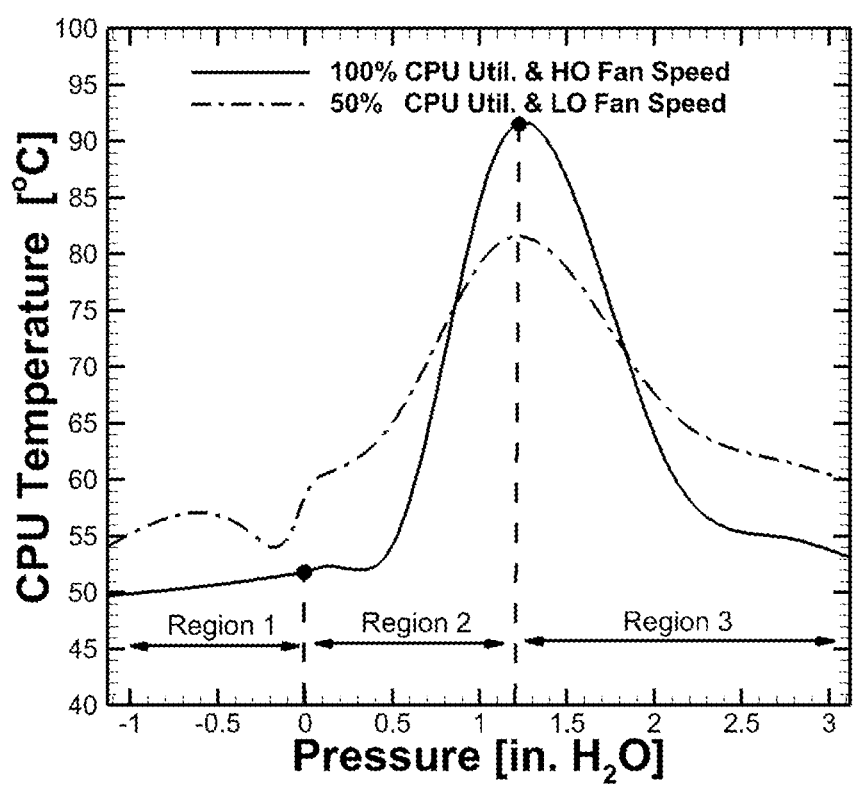
FIG. 3 shows an air pressure vs. CPU temperature curve for a 2U new generation server, at 50% and 100% CPU utilization.

Impact on CPU: A 2U compute server was connected through a Linux interface where the CPU utilization and the fans' RPM were controlled while mounted on the flow bench. The AFC (Active Flow Curve) experimental procedure was implemented at maximum fan speed and 100% CPU utilization. As the backpressure was varied, steady state temperature readings were taken for the CPU, as shown in FIG. 3.

The testing started at region 1 where the server was over-provisioned with airflow higher than its design airflow rate.

As aiding to air flow is reduced and the pressure values move from negative to zero at which the flow rate is at free delivery (FD). A very subtle increase in the CPU temperature is noted (50-52° C.). Increasing the backpressure further leads to flow region 2 in which CPU temperature starts to increase significantly, since the airflow is lower than designed although inlet temperature is maintained at 20° C., so concerns with IT reliability begin upon entering region 2. The backpressure is increased furthermore to reach PC. At this point the CPU temperature reaches the maximum value since airflow is near zero through the server. Therefore, heat transfer via forced convection is minimized and the package is primarily relying on conduction, an inefficient heat removal mechanism.

At that point the CPU has started to drop in voltage and frequency to reduce the heat flux, resulting in a loss of computational performance. Finally, as the flow curve moves into region 3, reverse airflow takes place. The system cools again due to forced convection. However, in a real-life case (not wind tunnel test) the rear of the server is in a hot aisle environment that is usually maintained at a high temperature to gain efficiency. This hot air will recirculate back into the contained aisle and cause issues for the surrounding IT equipment.

It is important to note that for acoustics and energy budget reasons, IT equipment usually operate at the low end of their air system's capacity. This implies that much lower external impedances are sufficient to cause problems.

Impact on HDD: To understand the effect of subtler airflow mismatches that can happen during normal operation, a back pressure of ~30 Pa (equal to the critical pressure) is applied to an open compute high density storage unit [Alissa, H., A., Nemati, K., Puvvadi, U., Sammakia, B. G., Mulay, V., Yan, M., R., Schneebeli, K., Seymour, M. J., Gregory, T., Effects of Airflow Imbalances on Open Compute High Density Storage Environment. Applied Thermal Engineering, 2016]. This is a longer duration transient test during which the response of the storage system is observed under a read/write job condition. In this test, no fan speed constraints were applied. This allows for observing the actual response of the hardware fans' algorithm. The test starts while the chassis is operating at its free delivery airflow with zero external impedance. Then a back pressure perturbation is introduced for ~70 minutes after that the system is relived. During this period the HDDs (Hard Disk Drives) heat up. The FCS (fan control system) responds to that, by increasing the fans' speed. After that, the external impedance is removed, the unit is allowed to recover and the RPM gradually drops to initial value. The storage unit has three rows of HDDs; front, middle, and rear. The rear HDDs can get thermally shadowed by the heat generated by the upstream components.

Bandwidth and Input-Output (I/O) are correlated to the thermal performance. It can be deduced that the rear HDDs, which are towards the back of the drawer, are generally observed to have a lower total I/O due to thermal preheating by the upstream HDDs and components. The total I/O reduction will accumulate to yield bigger differences over longer time intervals. The runtime displays the time interval during which the HDDs are performing a read or write command/request. When the HDDs start to overheat they also start to throttle (processing speed slows down as temperature increases) requests to write or read which explains the reduction in the runtime of the rear thermally shadowed HDDs.

The cooling control scheme of a typical modern data center can be based on Infrastructural temperature monitoring points at the IT equipment inlets or, alternatively, at locations specified for the IT analytics Intelligent Platform Management Interface (IPMI) data. These locations include ones within the equipment but near the air inlet. Usually, the IPMI inlet sensor reads a couple of degrees higher than the Infrastructural sensors due to preheating from components inside the chassis. However, the inconsistency rapidly grows between both measuring systems during airflow imbalances such as those experienced in containment.

It is important for safe data center operation to consider the dynamic airflow response of the IT equipment and their interaction with the data center. Various strategies are available to reduce risk of airflow imbalances:
1. Utilize pressure controlled cooling units—not only inlet temperature-based—to control the contained data center cooling.
2. Utilize pressure relief mechanisms such as automatically opened doors during power outages in containment.
3. Design the cooling system (CRAH, CRAC, Fans, wall, etc.) to be able to deliver the maximum airflow demand of IT. This will be of even greater importance when the containment is used in a free cooling scheme.
4. Consider the impact of the air system differences between the IT stacked in containment.
5. Utilize the difference between IPMI and Infrastructural sensors as an early alarm of overheating.
6. Possible airflow mismatches in containment (due to failures, virtualization and varying loads, etc.) require further availability and reliability guidelines to be incorporated with the current ASHRAE best practices (e.g., a server is specified for A2 temperature range within X range of back pressure/external impedance).

By employing these techniques, it is possible to better employ the advantages of containment to reduce operating costs and improve performance.

According to one aspect, a system and algorithms are provided for a data center-level control that optimize the operations to minimize energy consumption at any given performance level. The control system predicts cooling performance of IT based on data measured in the data center. The data may advantageously be pressure and fan speed data in the case of air cooling. This data is typically available, and if not, retrofits are possible to obtain it. The data may also be pressure and liquid flow rate in the case of liquid cooled systems. The data may include both air and liquid cooling flow rates in the case of hybrid data centers.

The control system works by modulating the cooling system, containment structure, and IT equipment for reliable operation and adequate IT processing performance. That is, an optimization is employed according to an objective function which seeks to achieve the desired level of performance (quality of service, performance metrics). Cost may be a criterion, since the problems typically arise as a result of cost-effective compromise in the design and/or operation of the data center. Therefore, the optimization typically seeks to achieve the desired or require performance at the lowest cost, while maintaining a safe margin of operation and fault tolerance. Thus, within the performance bounds, and weighing reliability as a cost as well, the cooling system and containment may be actively controlled to have the lowest feasible operating costs.

The control system may gather many data feeds, including for example: fans' average RPM (revolution per minute), temperatures, and (IT equipment level or aisle level) pressure differential, cooling system temperatures and air pressure, which provide inputs to the controller.

The control system can adaptively generate predictive models of the dynamic operating states of the IT equipment, that may be run in real time based on combinations of empirical data and physics based models. The predictive models may be verified by the controls, in terms of errors or deviations between the predicted performance and the observed performance. The errors may be used in some cases to improve the models, and in other cases, to indicate issues that require human analysis. For example, if a physical model is incorrect or incomplete, it may generate errors under certain conditions. When these conditions are understood, the model may be explicitly modified. If the errors are not understood, then the model itself can be made more complex, or operation with the model extended to a statistically safe margin given the errors observed.

The airflow may be predicted for every single piece of IT equipment, using the AFC method, or only for selected pieces. If the modelling is incomplete, there will be larger error in its use, since the unmodelled elements appear as correlated or uncorrelated noise, or complex and perhaps incorrect parameters of the modelled elements. However, using adaptive modelling techniques, it may be possible over time and experience, to implicitly model those elements that are not explicitly modelled.

Internal components temperatures (CPUs, RAMs, HDDs, etc.) may be reported using correlations.

The percentage of airflow surplus, balance or reduction (airflow regions 1, 2 and 3) is reported to the controller. As discussed above, it is generally desirable to operate in region 1, in which the equipment is fully specified. Region 2 leads to low air flow, and is to be actively avoided, for each piece of IT equipment. Since the conditions for entry into region 2 will differ for each piece of equipment, a predictive model is desired that will consider this issue for each heat-sensitive element. If operation in region 1 is unavailable, operation in region 3 is possible, and the control may make specific consideration of this possibility. For example, during intentional Region 3 operation, it may be desirable to turn off the (unidirectional) fans, which will impede cooling. As discussed above, intentional leaks between hot and cold aisle may be employed to reduce the hot aisle temperature and also reduce the hot aisle pressure. This may be done selectively and regionally within the data center.

The controller may modulate the cooling airflow, the containment artificial leakage and utilization of the IT equipment. That is, based on the datacenter thermal properties, selecting certain IT equipment, especially entire racks, to undertake load or to assume an idle, standby, or off state may be appropriate. When in a standby or off state, the cooling system may be controlled to reduce or eliminate unnecessary cooling to that IT equipment. When the IT equipment is in standby or off, and in some cases idle, fans may slow or shut down, leading to changes in pressure distribution within the datacenter. These changes are preferably explicitly modelled.

Other cooling methodologies, including liquid cooling, may also be utilized in conjunction with air cooling if and when necessary. Decisions on using other cooling media are subject to availability and the energy optimization metrics.

In case of airflow reduction, the controller can modulate the cooling airflow to increase volume, open leakage paths to maintain reliable operation, and avoid CPU throttling.

In case of cooling airflow failure, maintenance or operational airflow mismatch, the system can give early alarms warning of imminent overheating and of loss in computational abilities. These warnings may be issued before any actual change in the state of the IT equipment, based on predicted changes, some of which may be controlled by the controller. For example, in case of cooling equipment failure, the overheating or throttling of some equipment may be inevitable. The controller may therefore make an economic optimization of which equipment to preserve in the fully operational state, and which equipment to permit to heat and begin to throttle. Likewise, the response of the datacenter may have different time-constants and lags, which are considered in the model and prediction. For example, the controller may make a decision to switch some racks to Region 3 operation. In Region 3, the IT equipment will be running hotter, and may inevitably throttle. However, as a result of throttling, the power dissipation is reduced, and therefore the datacenter may enter various oscillations and compensation overshoots.

In case of cooling airflow failure, the controller may balance the pressure by introducing smart leakage paths to the containment. In case of disproportionate airflow reduction (when strong and weak IT equipment air systems are mixed), the controller can power cap IT equipment with stronger air systems to mitigate the airflow reduction in weaker IT air systems.

In cases of IT equipment which is turned off, the controller may determine the amount and direction of leakage (since the fans are not running) and indicate whether dampers are required to be operated to compensate. The controller can also modulate smart louvers that are mounted at the IT outlet vents or elsewhere within the datacenter air cooling system.

Some of the embodiments disclosed herein may be implemented in software, hardware, application logic, or a combination of software, hardware, and application logic. The software, application logic, and/or hardware may reside in memory, the control apparatus, or electronic components disclosed herein, for example. In some example embodiments, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed with respect to the nodes disclosed herein.

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

NOMENCLATURE

AFC Active Flow Curve
CAC Cold Aisle Containment
CPU Central Processing Unit
CRAC Computer Room Air Conditioner—Direct Expansion—.
CRAH Computer Room Air Handler—Chiller—
FD Delivery (Design) airflow, [m$^3$/s or CFM]
HAC Hot Aisle Containment HDD Hard Disk Drive
IO Input/output
IT Information Technology
IT Servers, switches, Blades . . .
IPMI Inelegant Platform Management Interface
NG New Generation server
PC Critical Backpressure, [Pa or in. $H_2O$]
SMART Data from a hard drive or solid state drive's self-monitoring capability
TOR Top of Rack

What is claimed is:

1. A control system for a data center having a cold air cooling system, a cold air containment structure receiving pressurized cold air from the cold air cooling system, and an air exhaust space, wherein information technology equipment (IT equipment) is provided within enclosures providing flow paths between the cold air containment structure and the air exhaust space, the control system comprising:
at least one input configured to receive information for determining at least an air pressure of the cold air containment structure and at least a pressure of the air exhaust space;
an output port configured to communicate a control signal to control at least one of a leakage device configured to control air flow across a boundary of the cold air containment structure, and a damper configured to restrict an air flow through the cold air containment structure; and
at least one processor, configured to:
receive the information from the at least one input;
determine an air flow through a plurality of IT equipment enclosures;
determine an insufficient cooling condition for at least one IT equipment enclosure; and
produce a control signal at the output port to control the leakage device, wherein the control signal is adapted to reduce a pressure in the cold air containment structure and thereby increase cooling of the at least one IT equipment enclosure for which the insufficient cooling condition is determined, the control signal conveying information to at least one of:
increase a leakage through the leakage device through a path excluding the at least one IT equipment enclosure for which the insufficient cooling condition is determined, and
restrict the air flow through the cold air containment structure with the damper.

2. The control system according to claim 1, wherein the enclosure of the at least one IT equipment determined to have an insufficient cooling condition has a fan configured to induce increase a backpressure between a respective cold air containment structure and a respective air exhaust space, and is subject to an operating condition wherein the respective cold air containment structure has a lower pressure than the respective air exhaust space, such that an increase in fan speed reduces air flow through the at least one IT equipment enclosure,
wherein the control signal at the output port is adapted to increase a reverse flow of air through the enclosure of the at least one IT equipment determined to have an insufficient cooling from the air exhaust space to the cold air containment structure.

3. The control system according to claim 1, wherein the at least one automated processor is further configured to control the cold air cooling system.

4. The control system according to claim 1, wherein the at least one automated processor is further configured to control a performance of the IT equipment.

5. The control system according to claim 1, wherein the at least one automated processor is configured to produce the control signal, control the cold air cooling system, and control a performance of the IT equipment.

6. The control system according to claim 1, wherein the at least one IT equipment enclosure for which the insufficient cooling condition is determined has a fan which is thermally responsive and is not controlled by the control system, wherein the at least one automated processor further comprises a computational model for predicting sufficiency of cooling of the at least one IT equipment enclosure dependent on performance, a state of the cold air containment structure, and a state of the air exhaust structure.

7. The control system according to claim 6, wherein the control signal is adapted to alter the state of the cold air containment structure and the state of the air exhaust structure.

8. The control system according to claim 1, wherein the at least one automated processor is further configured to determine joint optimum states of the cold air cooling system, the control signal, and the IT equipment, and is further configured to control the cold air cooling system and the IT equipment selectively dependent on the determined joint optimum states.

9. The control system according to claim 1, wherein the at least one automated processor is further configured to receive fan speed information from the IT equipment enclosures.

10. The control system according to claim 1, wherein the IT equipment has an intrinsic thermal excursion throttling response that reduces processing performance under predetermined thermal conditions, and the at least one automated processor is further configured to model the throttling response of the IT equipment.

11. The control system according to claim 1, wherein the at least one automated processor is further configured to predict a null air flow through a respective IT equipment enclosure due to back pressure against operation of a fan in the IT equipment enclosure.

12. The control system according to claim 1, wherein the control signal is adapted to control the leakage device.

13. The control system according to claim 1, wherein the control signal is adapted to control the damper.

14. The control system according to claim 1, wherein the at least one automated processor is further configured to detect a state of the cold air cooling system, and selectively in response to the detected state of the cold air cooling system, generate an IT equipment control signal to reduce a power dissipation of a first portion of the IT equipment to selectively mitigate a reduction in cold air available to a second portion of the IT equipment.

15. A control system for a data center, comprising:
a cold air cooling system;
a cold air containment structure receiving pressurized cold air from the cold air cooling system;
an air exhaust space;
a plurality of information technology equipment (IT equipment) enclosures providing flow paths between the cold air containment structure and the air exhaust space,
at least one input configured to receive information for determining a state of the cold air containment structure and a state of the air exhaust space;

an output port configured to communicate a control signal to control a pressure of the cold air containment structure; and at least one processor, configured to:
 determine an air flow through the plurality of IT equipment enclosures based on the at least one input;
 determine an insufficient cooling condition for at least one IT equipment enclosure; and
 produce a control signal at the output port, wherein the control signal is adapted to reduce a pressure in the cold air containment structure and thereby increase cooling of the at least one IT equipment enclosure for which the insufficient cooling condition is determined.

16. The control system according to claim 15, wherein the control signal is configured to at least one of:
 control a leakage device to increase a leakage through the leakage device through a path excluding the at least one IT equipment enclosure for which the insufficient cooling condition is determined; and
 control a damper to restrict the air flow through the cold air containment structure,
 to thereby cause an increase a flow of air through the at least one IT equipment enclosure for which the insufficient cooling condition is determined.

17. The control system according to claim 15, wherein the enclosure of the at least one IT equipment determined to have an insufficient cooling condition has a thermally-responsive fan configured to induce increase a backpressure between a respective cold air containment structure and a respective air exhaust space, and is subject to an operating condition wherein the respective cold air containment structure has a lower pressure than the respective air exhaust space, such that an increase in fan speed reduces air flow through the at least one IT equipment enclosure,
 wherein the control signal is adapted to increase a reverse flow of air through the enclosure of the at least one IT equipment determined to have an insufficient cooling from the air exhaust space to the cold air containment structure,
 wherein the at least one automated processor is further configured to control the cold air cooling system and to control a performance of the IT equipment based on a computational model of the data center.

18. A control method, for controlling a data center having a cold air cooling system, a cold air containment structure receiving pressurized cold air from the cold air cooling system, and an air exhaust space, wherein information technology equipment (IT equipment) is provided within enclosures providing flow paths between the cold air containment structure and the air exhaust space, the control method comprising:
 determining at least an air pressure of the cold air containment structure;
 determining at least a pressure of the air exhaust space;
 determining an air flow through a plurality of IT equipment enclosures;
 determine an insufficient cooling condition for at least one IT equipment enclosure; and
 reducing a pressure in the cold air containment structure and thereby increasing a cooling of the at least one IT equipment enclosure for which the insufficient cooling condition is determined.

19. The control method according to claim 18, wherein the pressure in the cold air containment structure is controlled to at least one of:
 increase a leakage through the leakage device through a path excluding the at least one IT equipment enclosure for which the insufficient cooling condition is determined, and
 restrict the air flow through the cold air containment structure with a damper,
 to thereby increase an air flow in the IT equipment enclosure for which the insufficient cooling condition is determined.

20. The control method according to claim 18, wherein the enclosure of the at least one IT equipment determined to have an insufficient cooling condition has a thermally-responsive fan configured to induce increase a backpressure between a respective cold air containment structure and a respective air exhaust space;
 further comprising subjecting the plurality of IT equipment enclosures to an operating condition wherein the respective cold air containment structure has a lower pressure than the respective air exhaust space, such that an increase in fan speed reduces air flow through the at least one IT equipment enclosure;
 increasing a reverse flow of air through the IT equipment enclosure determined to have an insufficient cooling from the air exhaust space to the cold air containment structure; and
 controlling the cold air cooling system and a performance of the IT equipment based on a computational model of the data center.

* * * * *